United States Patent
Tokunaga et al.

(10) Patent No.: US 10,495,505 B2
(45) Date of Patent: Dec. 3, 2019

(54) CAPACITANCE LIQUID LEVEL SENSOR

(71) Applicant: SEMICONDUCTOR COMPONENTS INDUSTRIES, LLC, Phoenix, AZ (US)

(72) Inventors: Tetsuya Tokunaga, Oura-gun (JP); Takayasu Otagaki, Ota (JP); Kazuyoshi Ishikawa, Kumagaya (JP); Stephen John Sheard, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 141 days.

(21) Appl. No.: 15/628,232

(22) Filed: Jun. 20, 2017

(65) Prior Publication Data
US 2018/0058897 A1   Mar. 1, 2018

Related U.S. Application Data

(60) Provisional application No. 62/378,593, filed on Aug. 23, 2016.

(51) Int. Cl.
*G01F 23/26* (2006.01)
*G01F 25/00* (2006.01)
*H03K 17/955* (2006.01)

(52) U.S. Cl.
CPC ......... *G01F 23/266* (2013.01); *G01F 23/261* (2013.01); *G01F 23/268* (2013.01); *G01F 25/0061* (2013.01); *G01F 25/0076* (2013.01); *H03K 17/955* (2013.01); *H03K 2217/9401* (2013.01)

(58) Field of Classification Search
CPC ............................................. G01F 23/263–268
See application file for complete search history.

(56) References Cited

U.S. PATENT DOCUMENTS

3,161,054 A * 12/1964 Cohn ................ G01F 23/266 324/611
4,568,874 A *  2/1986 Kramer ............. G01F 23/266 324/611

(Continued)

FOREIGN PATENT DOCUMENTS

EP   1553389 A1   7/2005

OTHER PUBLICATIONS

International Search Report for counterpart Application No. PCT/US2017/039219, dated Sep. 13, 2017, 4 pages.

*Primary Examiner* — Peter J Macchiarolo
*Assistant Examiner* — Alexander A Mercado
(74) *Attorney, Agent, or Firm* — Ramey & Schwaller, LLP

(57) ABSTRACT

In accordance with at least one embodiment, a method for detecting a liquid level includes providing a container (402) having a cavity, and disposing a sensor (102) in the cavity of the container (402), such that a ground pattern (310) on a first surface of the sensor (102) is positioned to contact a liquid in the cavity. A first electrode (104) and a second electrode (106) are located on a second surface of the sensor (102). The sensor (102) is coupled to a sensor input and a sensor driver. A cable coupling the sensor (102) to a touch sensor (116) comprises a shield line (112, 114) that is coupled to ground.

11 Claims, 22 Drawing Sheets

(56) References Cited

U.S. PATENT DOCUMENTS

| | | | | |
|---|---|---|---|---|
| 5,077,527 | A * | 12/1991 | Patriquin | G01D 5/24 |
| | | | | 324/608 |
| 6,011,490 | A * | 1/2000 | Tonnesen | B04B 13/00 |
| | | | | 340/603 |
| 6,101,873 | A | 8/2000 | Kawakatsu et al. | |
| 6,490,920 | B1 * | 12/2002 | Netzer | G01C 9/06 |
| | | | | 324/687 |
| 2001/0000851 | A1 * | 5/2001 | Morimoto | G01F 23/266 |
| | | | | 73/304 C |
| 2009/0301188 | A1 | 12/2009 | Calcote | |
| 2011/0162448 | A1 * | 7/2011 | McGaughey | G01F 23/266 |
| | | | | 73/304 C |
| 2016/0202104 | A1 * | 7/2016 | Shibata | G01F 23/265 |
| | | | | 73/304 C |
| 2016/0370219 | A1 * | 12/2016 | Munoz | G01F 23/263 |
| 2017/0299416 | A1 * | 10/2017 | Rondano | G01F 23/263 |
| 2017/0299417 | A1 * | 10/2017 | Otagaki | G01F 23/265 |

* cited by examiner

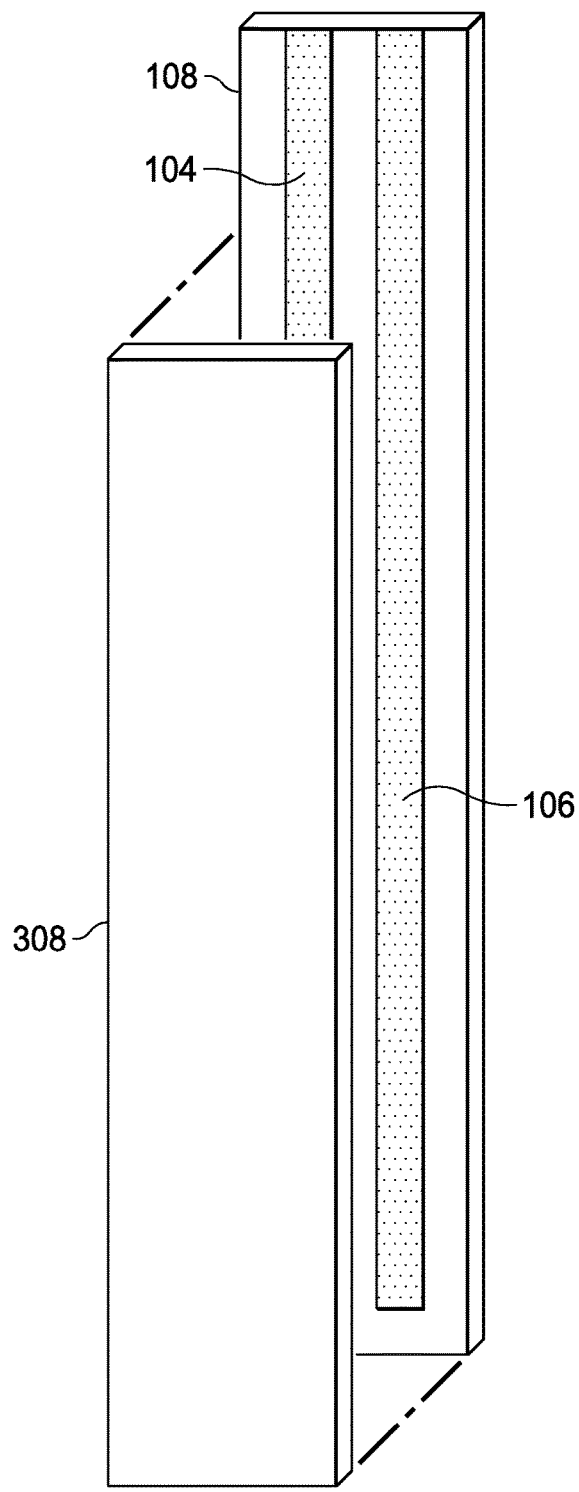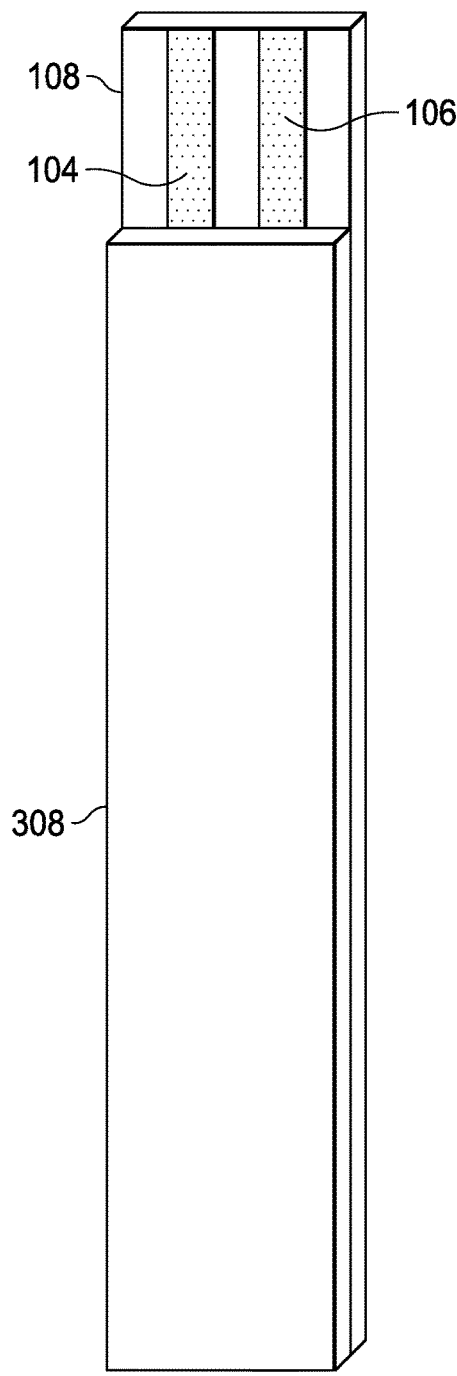
FIG. 3A
FIG. 3B

CAPACITANCE LIQUID LEVEL SENSOR

CROSS-REFERENCE TO RELATED APPLICATION(S)

This application claims the benefit of U.S. Provisional Application No. 62/378,593, filed Aug. 23, 2016, the contents of which are incorporated by reference herein in their entirety.

TECHNICAL FIELD

Embodiments of the present invention relate, in general, to electronics and, more particularly, to sensors and methods for detecting a level of a fluid in a container.

BACKGROUND

In the past, the semiconductor industry used various methods and sensors for detecting changes in physical attributes and generating a signal indicative of those changes. Sensors are useful in mechanical systems, chemical systems, and biological systems, among others. For example, in mechanical systems sensors are useful in providing output information based on velocity, position, movement, temperature, altitude, etc.; in chemical systems sensors are used to provide information about the chemical composition of their environment; and in biological systems sensors provide information about analytes present in a biological environment. In the electronics industry touch sensors have been used as input device for electronic devices such as mobile phones, portable audio devices, portable game consoles, televisions, and personal computers. An example of a prior electrostatic capacity type of touch sensor was disclosed in U.S. Pat. No. 8,618,818, titled "Electrostatic Capacity Type Touch Sensor" by Takayasu Otagaki et al. and issued on Dec. 31, 2013.

BRIEF DESCRIPTION OF THE DRAWINGS

Embodiments of the present invention will be better understood from a reading of the following detailed description, taken in conjunction with the accompanying drawing figures, in which like reference characters designate like elements and in which:

FIGS. 3A, 3B and 3C are schematic diagrams showing assembly of the sensor 102 according to at least one embodiment;

Figure 1A:
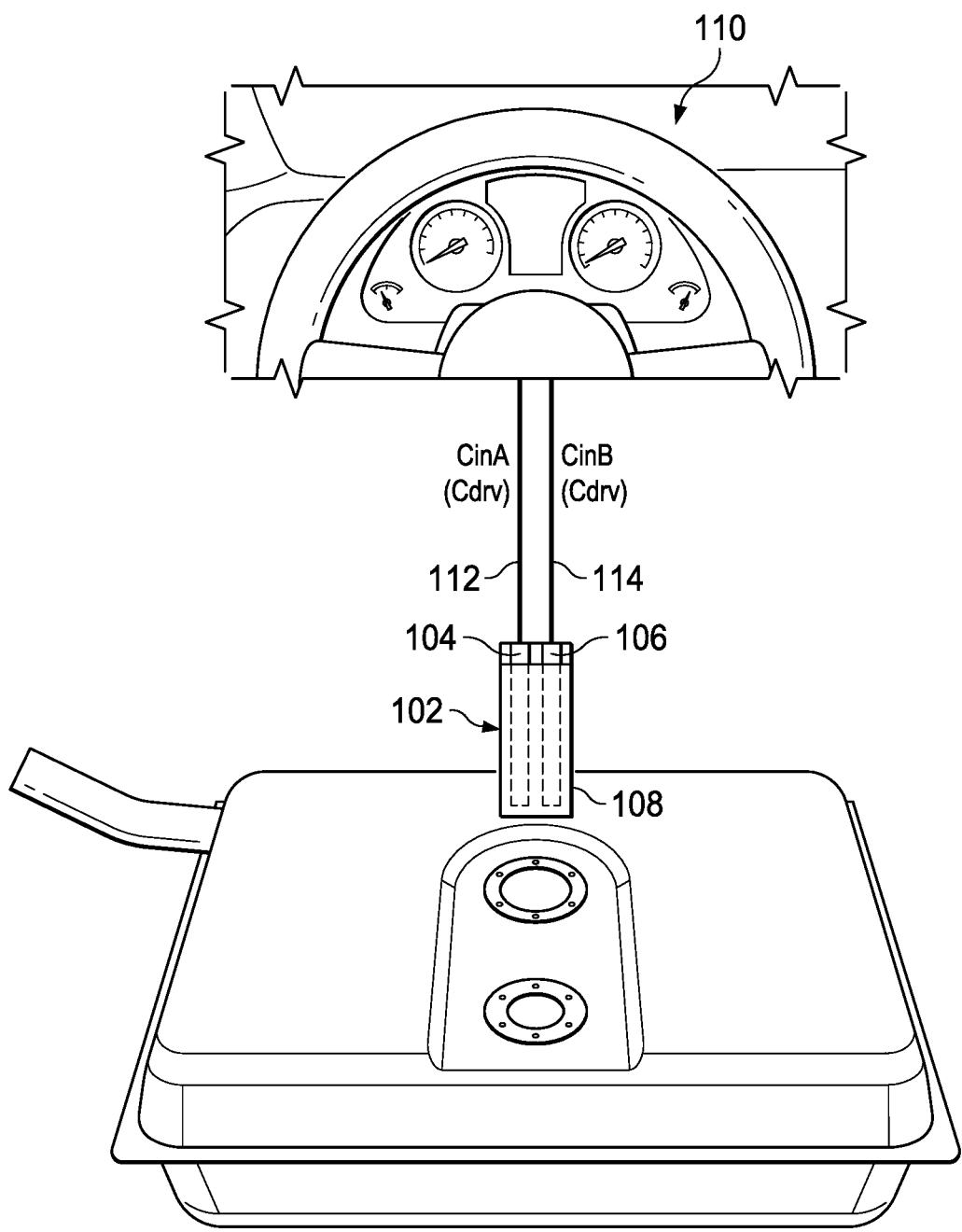
FIGS. 1A and 1B are schematic diagrams showing examples of liquid level detection according to at least one embodiment.

For simplicity and clarity of illustration, elements in the figures are not necessarily to scale, and the same reference characters in different figures denote the same elements. Additionally, descriptions and details of well-known steps and elements are omitted for simplicity of the description. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there may be minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

With reference to various embodiments of the present invention, structures and methods for detecting a liquid level in a container are disclosed. According to various embodiments, a sensor structure is placed in the fluid container. The level of the liquid can be determined, whether the fluid is (more) electrically conductive, or (more) electrically insulating.

In accordance with at least one embodiment, a method for detecting a liquid level includes providing a container having a cavity, and disposing a sensor in the cavity of the container, such that a ground pattern on a first surface of the sensor is positioned to contact a liquid in the cavity. A first electrode and a second electrode are located on a second surface of the sensor. The sensor is coupled to a sensor input and a sensor driver. A cable coupling the sensor to a touch sensor includes a shield line that is coupled to ground.

According to at least one embodiment, an apparatus for detecting a liquid level includes a sensor positioned in a cavity of a container, and coupled to a sensor input and a sensor driver. The sensor includes a ground pattern positioned on a first surface of the sensor to contact a liquid in the cavity, a first electrode positioned on a second surface of the sensor module, and a second electrode positioned on the second surface of the sensor module. A cable coupling the sensor to a touch sensor includes a shield line that is coupled to ground.

Each of the foregoing embodiments may be implemented in combination and/or may include one or more of the following features in any combination: (1) further including: at a first time, coupling the sensor input and the sensor driver to the first electrode and the second electrode, respectively; and at a second time different from the first time, coupling the sensor driver and the sensor input to the first electrode and the second electrode, respectively; (2) further including: performing a first measurement at the first time when the sensor driver is coupled to the second electrode; and performing a second measurement at the second time when the sensor driver is coupled to the first electrode; (3) further including determining an average of the first measurement and the second measurement; (4) wherein the average is determined at a microcontroller, an application-specific integrated circuit (ASIC), a system-on-chip (SOC), a digital signal processor (DSP), or the touch sensor; (5) further including: performing a system calibration; and reading a result of the system calibration; (6) further including storing the result of the system calibration in a nonvolatile memory including an EEPROM or flash memory; (7) wherein the nonvolatile memory is external of the touch sensor; (8) wherein the nonvolatile memory is internal to the touch sensor; (9) wherein: at a first time, the sensor input and the sensor driver are coupled to the first electrode and the second electrode, respectively; and at a second time different from the first time, the sensor driver and the sensor input are coupled to the first electrode and the second electrode, respectively; (10) wherein: the sensor performs a first measurement at the first time when the sensor driver is coupled to the second electrode; and the sensor performs a second measurement at the second time when the sensor driver is coupled to the first electrode; (11) wherein an average of the first measurement and the second measurement is determined; (12) further including a microcontroller, an application-specific integrated circuit (ASIC), a system-on-chip (SOC), a digital signal processor (DSP), or the touch sensor for determining the average of the first measurement and the second measurement; (13) further including a microcontroller for initiating performance of a system calibration, and reading a result of the system calibration; (14) wherein the microcontroller stores the result of the system calibration in a nonvolatile memory including an EEPROM or flash memory; (15) wherein the nonvolatile memory is external of the touch sensor; (16) wherein the nonvolatile memory is internal to the touch sensor.

By way of example, one method of liquid level detection involves measuring the voltage gap between two terminals of a rheostat with two wires. A float is connected (or coupled) to the rheostat. The float is provided inside a container. A needle of the rheostat is pointed according to the position of the float. The position of the float changes based on a level of liquid inside the container.

When the position of the needle changes, a resistance value between the two terminals of the rheostat also changes. The liquid level detection is based on the change in the resistance value.

However, an unevenness in the resistance value may be caused by abrasion of the rheostat. Also, an unevenness in the resistance value may be caused by adhesion (or collection) of dust in the liquid during use over time. For example, dust (or some other material) may collect on the surface of the liquid over time. Therefore, accurately detecting the liquid level may prove challenging.

As another example, a method of liquid level detection involves using a Hall sensor. For example, a fuel gauge module is provided in a fuel tank. The module includes a Hall sensor and a float. The module is connected (or coupled) to a dash board via three wires (e.g., Vcc line, Gnd (ground) line and S line). The Vcc and Gnd lines are power supply lines of the Hall sensor IC (integrated circuit). The S line carries a signal indicating the strength of a magnetic force that the Hall sensor detects. Depending on the position of the float, an output signal of the S line changes.

The noted method requires three wires (or cables): two wires for power supply to a sensor component (e.g., the Hall sensor IC) and a third wire for carrying an output signal of the sensing result. If any of these cables has a length greater than a particular value (e.g., 3 meters (m)), manufacturing costs are increased. In addition, an adhesion of a metal dust in the liquid may occur during operation, due to generation of a magnetic force field. This may increase friction that is encountered by a moving part of the Hall sensor. For such reasons, accuracy of the detected results may be adversely affected.

As another example, a method of liquid level detection involves self-capacitance sensing. In this situation, a parasitic capacitance may affect the accuracy of measurements, especially if cables are longer than a certain length (e.g., more than 0.5 m).

Aspects of this disclosure are directed to liquid level detection. According to at least one embodiment, detecting the liquid level includes detecting a change (e.g., increase or decrease) in the magnitude of an electric force that flows between two electrodes of a sensor. The sensor is located inside a container. The magnitude of the electric force increases or decreases according to the volume of liquid inside the container. The two electrodes include a first electrode and a second electrode. At a particular time, one electrode (e.g., the first electrode) serves as an input electrode for receiving a sensor input signal, and another electrode (e.g., the second electrode) serves as a drive electrode for receiving a drive signal. The functions of the first and second electrodes may be reversed (or swapped) during operation. For example, at another time, the first electrode serves as a drive electrode for receiving the drive signal, and the other electrode (e.g., the second electrode) serves as an input electrode for receiving the sensor input signal.

As will be described in more detail later, accurate detection of the level of liquid inside the container may be achieved, whether the liquid is electrically conductive or electrically insulating. Providing the drive signal to different electrodes at different times reduces the likelihood that metal dust will adhere to the liquid over time. Also, the shape and/or size of the sensor can be varied to conform with the shape and/or size of the container in which the sensor will be positioned. For example, the sensor can have any of various shapes and/or sizes, as long as it can be properly positioned inside the container for purposes of detecting the liquid level.

Figure 1B:
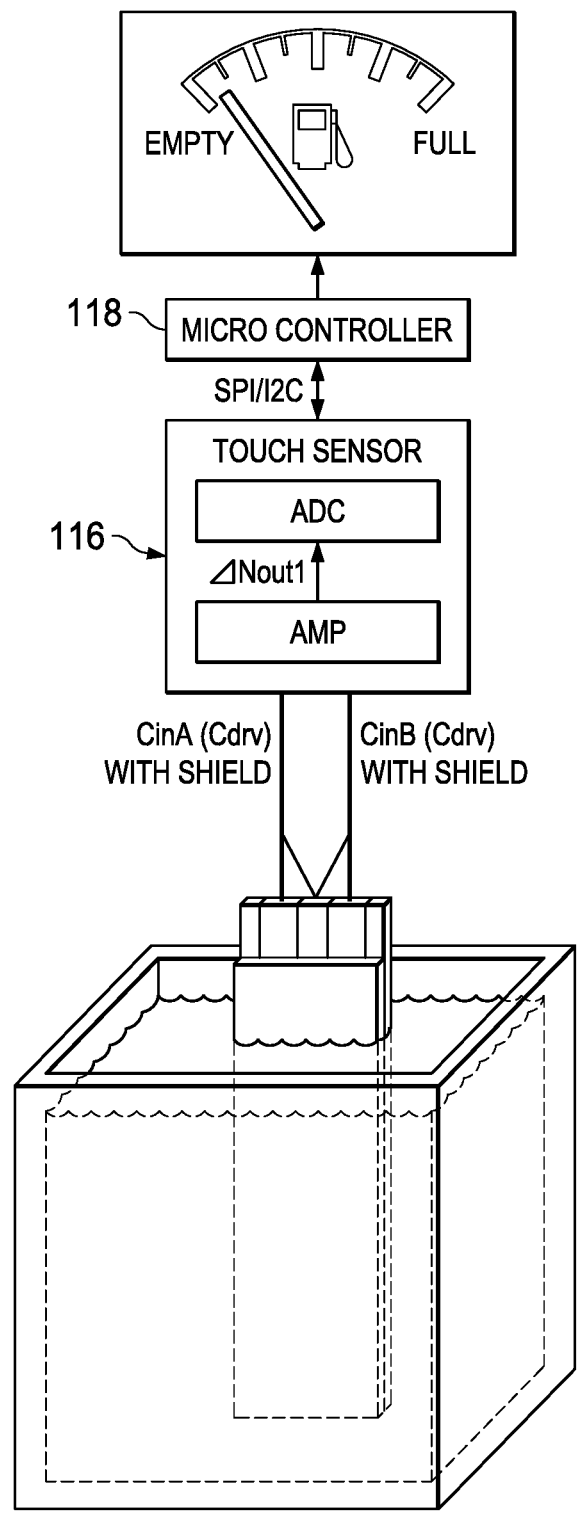

FIGS. 1A and 1B are schematic diagrams showing examples of liquid level detection according to at least one embodiment. An example of a sensor 102 is illustrated in FIG. 1A. As will be described in more detail later with respect to at least one embodiment, the sensor 102 includes a first electrode 104 and a second electrode 106. The electrodes 104 and 106 are located on one side (or surface) of a printed circuit board (PCB) 108. A ground pattern is located on the other side of the PCB 108. At least portions of the electrodes 104 and 106 may be covered by a liquid proof material.

The sensor 102 is connected to a dash board 110 by two shielded wires. The dash board 110 may be located inside an automobile, for example. The shielded wires include a wire 112 and a wire 114. The wires 112 and 114 carry sensor input signals and sensor drive signals. The wire 112 may be referred to as a CinA(Cdrv) wire, and the wire 114 may be referred to as a CinB(Cdrv) wire. At a particular time, the wire 112 carries a sensor input signal CinA, and the wire 114 carries a sensor drive signal Cdrv. At another time, the wire 112 carries the sensor drive signal Cdrv, and the wire 114 carries a sensor input signal CinB. According to at least one embodiment, the sensor input signals CinA and CinB are different from each other. According to at least one other embodiment, the sensor input signals CinA and CinB are the same signal.

With reference to FIG. 1B, in at least one embodiment, the sensor 102 is coupled to the dash board 110 via a large-scale integration (LSI) touch sensor 116. The touch sensor 116 includes an analog-to-digital converter (ADC) and an amplifier (AMP). The ADC converts an analog signal of a sensing result (e.g., from the AMP) to a digital signal. The touch sensor 116 is connected to a microcontroller 118 by a serial peripheral interface (SPI) or Inter Ic (I2C) bus. The microcontroller 118 receives the sensing result from the touch sensor 116 and, accordingly, controls a display on the dash board 110. For example, the microcontroller 118 may control a fuel gauge meter on the dash board 110.

According to various embodiments, the liquid level detection is not influenced by parasitic capacitance, or, at least, the effects of parasitic capacitance on the accuracy of the liquid level detection are reduced. For example, in at least some embodiments, the detection involves determining a change in capacitance. For example, a change in a capacitance formed between two electrodes (e.g., first electrode 104 and second electrode 106) is determined. Accordingly, an accurate detection of a liquid level can be performed even if cables (e.g., wires 112 and 114) exceed a particular length (e.g., 5 m). According to at least some embodiments, the detection can be performed accurately regardless of electrical properties of the liquid—e.g., whether the liquid has electrically conductive or semi-conductive properties, or whether the liquid has electrically insulating properties. According to at least some embodiments, the sensor may have any of various shapes and/or sizes, for proper placement inside a container. Accordingly, the sensor may be used for detecting a liquid level in any of various containers (e.g., containers of various shapes and/or sizes).

According to at least some embodiments, accuracy of the liquid level detection is improved by using results of a 2-channel sensor. For example, the results of the 2-channel sensor may be averaged. According to at least some embodiments, the direction of an electric field between two electrodes (e.g., electrodes 104 and 106) is changed during operation of the sensor. For example, in operation, a particular electrode functions as either a sensor input electrode or a sensor driver electrode. During operation, the function of the electrode changes. For example, at one time, the electrode 104 functions as a sensor input electrode, and the electrode 106 functions as a sensor driver electrode. At another time, the electrode 104 functions as a sensor driver electrode, and the electrode 106 functions as a sensor input electrode. Because the direction of the electric field between the electrodes 104 and 106 is changed during operation, an adhesion or collection of a substance such as dust may be reduced or prevented (e.g., on the surface of the liquid).

Figure 2A:
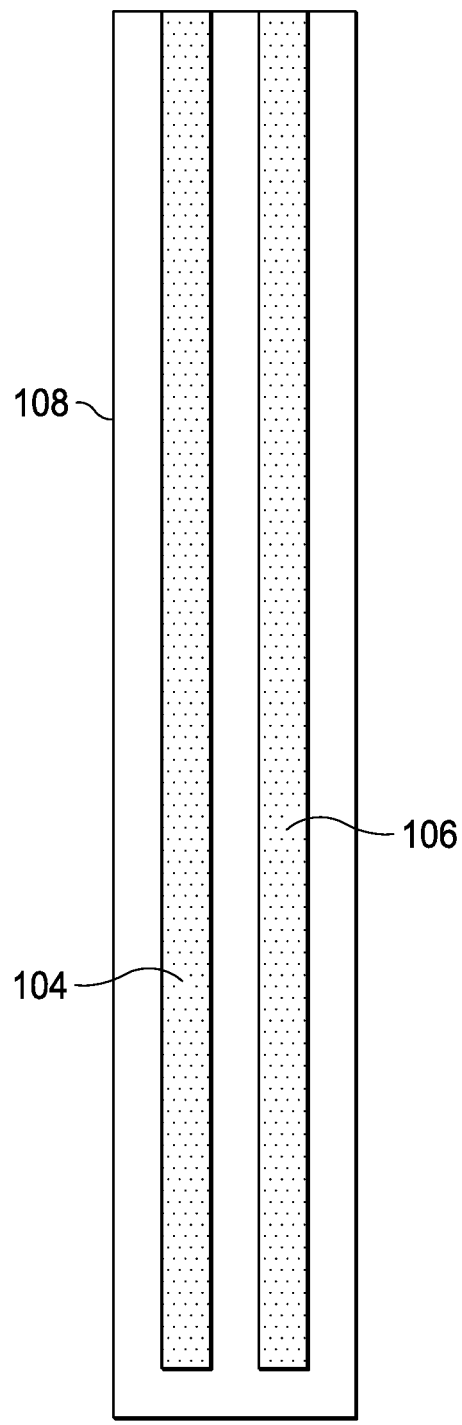
FIG. 2A illustrates a view of one side of a portion of a sensor according to at least one embodiment.

FIG. 2A illustrates a view of one side of a portion of the sensor 102 according to at least one embodiment. In particular, FIG. 2A illustrates a view of a top side of a middle layer of the sensor 102. Electrodes 104 and 106 are positioned on one side of the PCB 108. In at least one embodiment, the PCB 108 is a glass epoxy board. In other embodiments, the PCB 108 is formed of other materials. For example, the PCB 108 may be a plastic board.

Figure 2B:
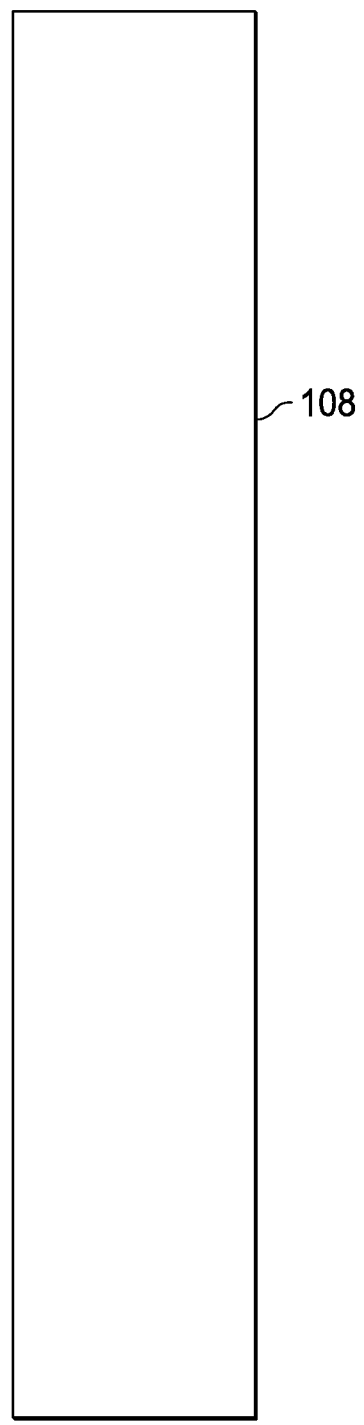
FIG. 2B illustrates a view of another side of the portion of the sensor according to at least one embodiment.

FIG. 2B illustrates a view of another side of the portion of the sensor 102 according to at least one embodiment. In particular, FIG. 2B illustrates a view of the bottom side of the middle layer of the sensor 102.

Figure 3C:
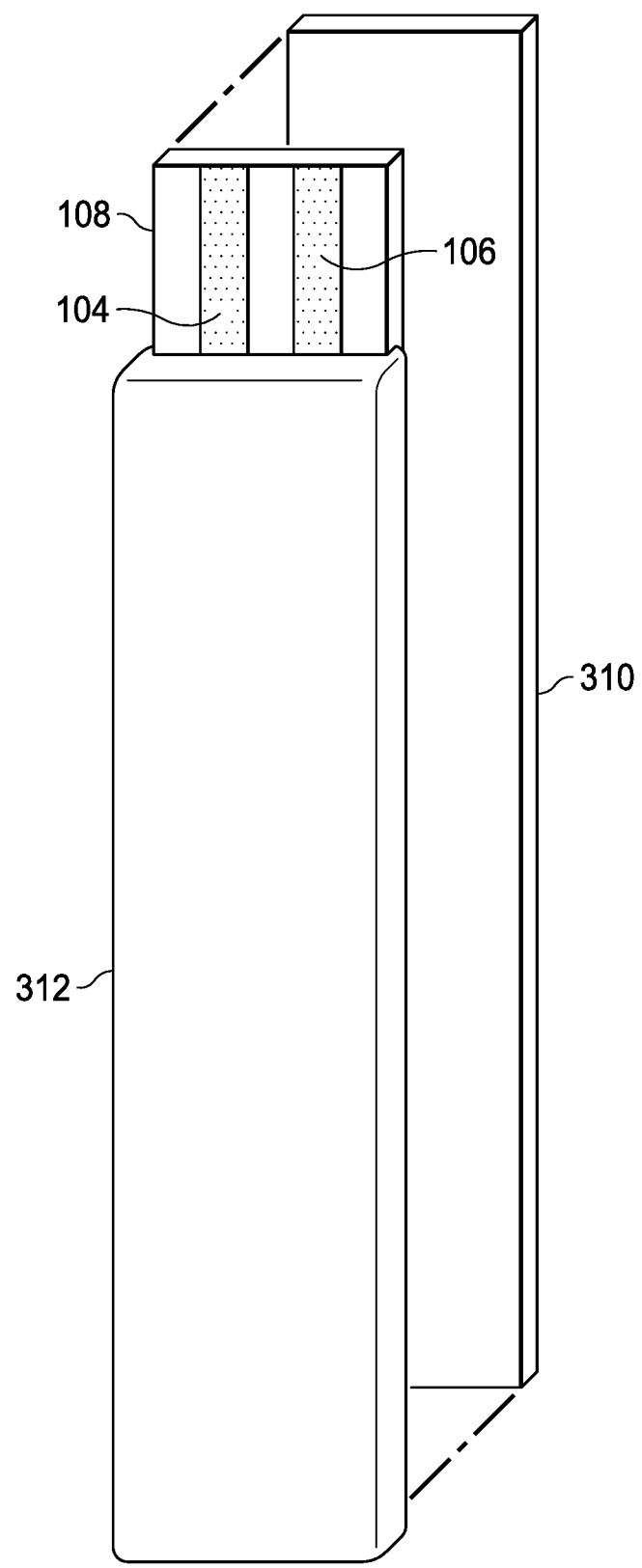

FIGS. 3A, 3B and 3C are schematic diagrams showing assembly of the sensor 102 according to at least one embodiment. FIGS. 3A, 3B and 3C illustrate views of the middle layer and other layers of the sensor 102. With reference to FIG. 3A, a PCB 308 is disposed against the PCB 108. The PCB is disposed against the side of the PCB 108 on which the electrodes 104 and 106 are positioned. For example, the PCB 308 is disposed against the top side illustrated in FIG. 2A. In at least one embodiment, the PCB 308 is a glass epoxy board. In other embodiments, the PCB 308 is formed of other materials. For example, the PCB 308 may be a plastic board. After the PCB 308 is positioned opposite the PCB 108, at least portions of the electrodes 104 and 106 remain exposed (e.g., uncovered by the PCB 308).

With reference to FIG. 3B, the PCB 308 is adhered to the PCB 108. For example, in at least one embodiment, the PCB 308 is adhered to the PCB 108 using an adhesive suitable for plastic materials (e.g., 3M™ Scotch®). With reference to FIGS. 3B and 3C, an opposite surface of the PCB 308 (facing away from the PCB 108) is made liquid proof. For example, in at least one embodiment, the opposite surface of the PCB 308 is covered with a liquid proof material 312 (e.g., waterproofing tape).

With further reference to FIG. 3C, a GND pattern 310 is disposed on an opposite side of the PCB 108. For example, the GND pattern 310 is positioned against the bottom side illustrated in FIG. 2B. The GND pattern 310 is formed of an electrically conductive material such as copper. In least one embodiment, the GND pattern 310 is adhered to the PCB 108 using an adhesive such as glue.

Figure 4A:
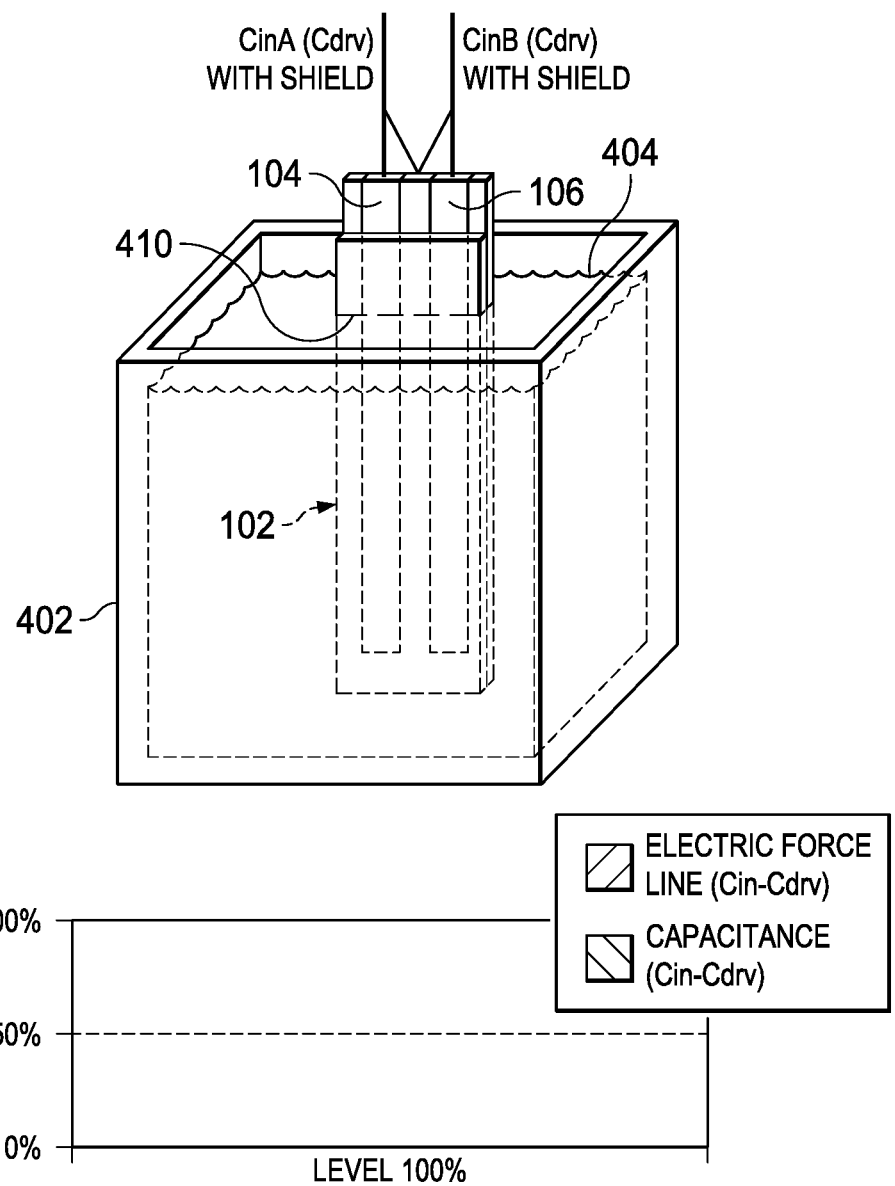
FIGS. 4A, 4B and 4C illustrate usage scenarios of the sensor according to at least one embodiment.
Figure 4B:
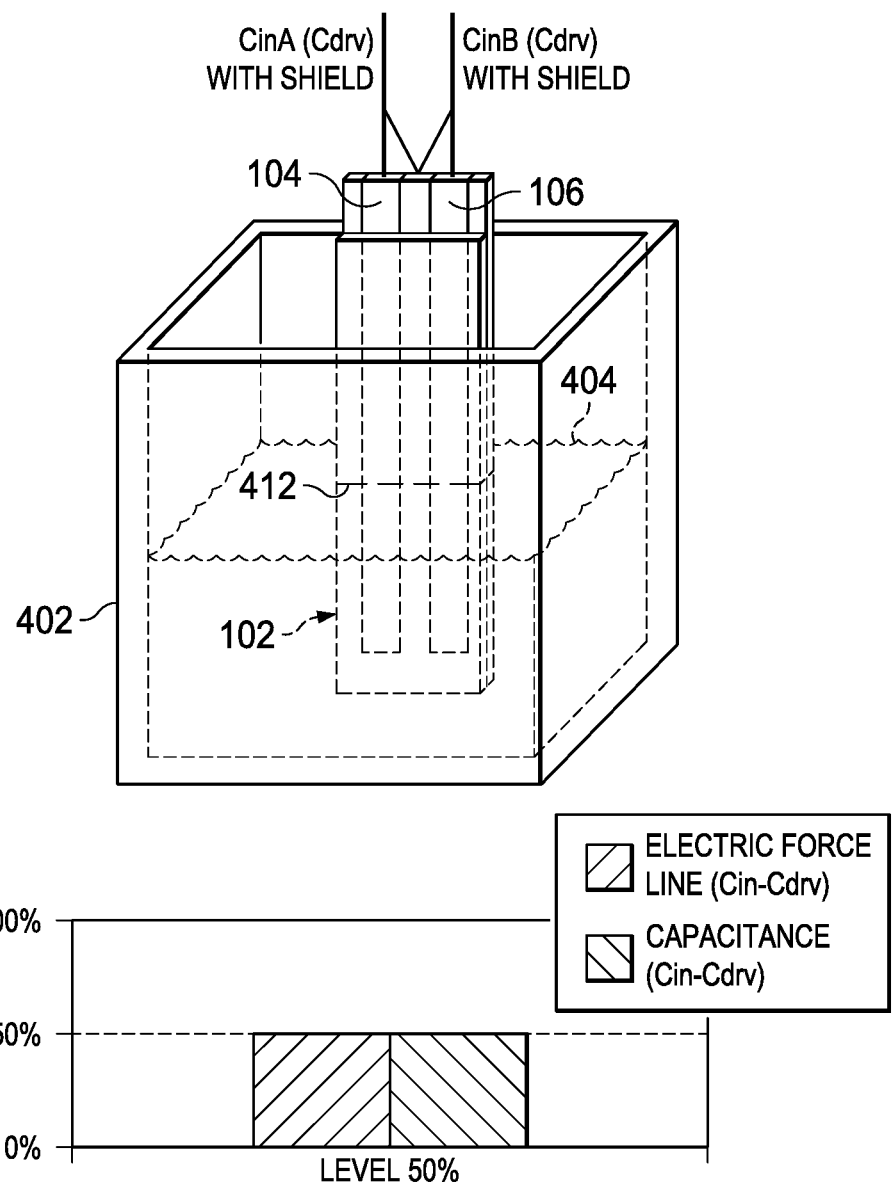
Figure 4C:
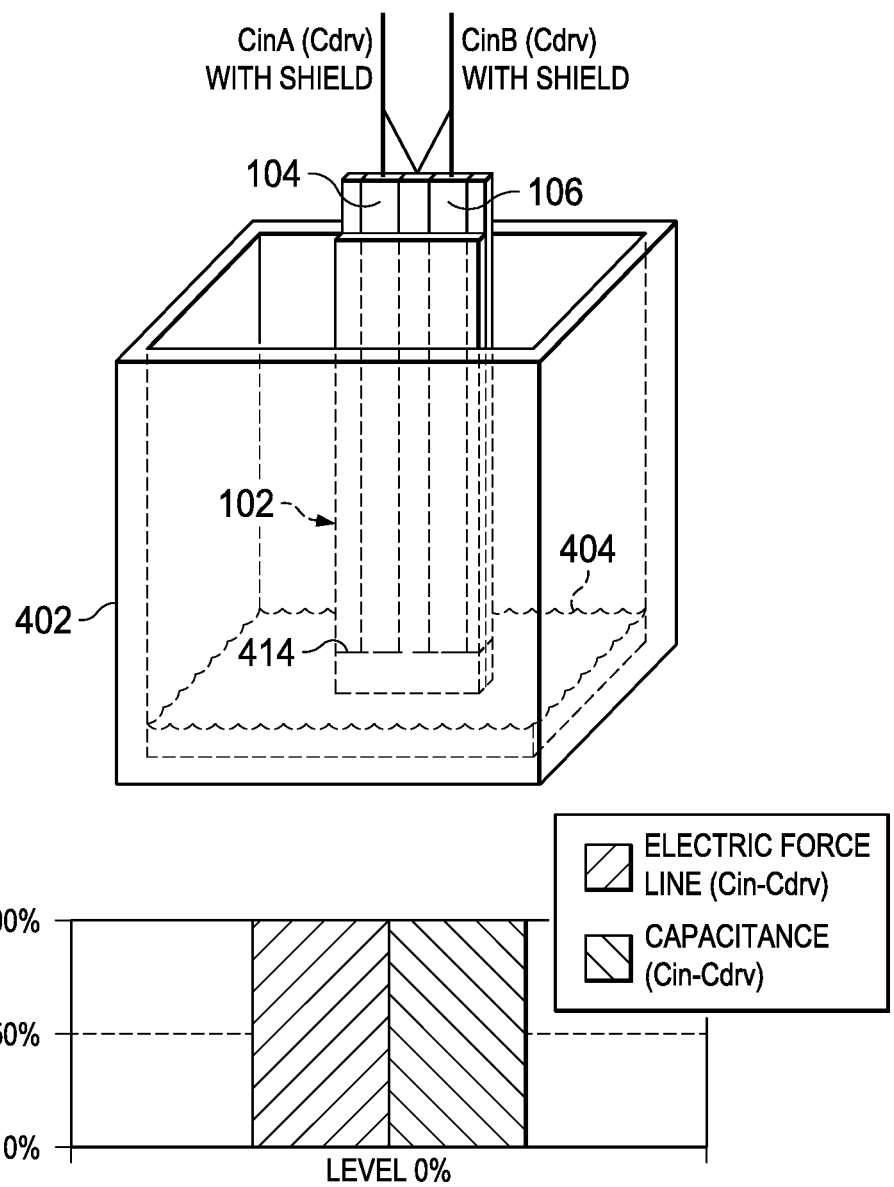

FIGS. 4A, 4B and 4C illustrate usage scenarios of the sensor 102 according to at least one embodiment. In FIGS. 4A, 4B, 4C, the sensor 102 is positioned inside a container 402. The container 402 contains a liquid 404 that has electrically conductive (or semiconductive) characteristics. Because the liquid 404 has conductive characteristics, the liquid does not serve as a particularly good dielectric.

At certain times, a first one of the electrodes (e.g., electrode 104) serves as a sensor input electrode that receives a sensor input signal, while a second one of the electrodes (e.g., electrode 106) serves as a sensor driver electrode that receives a sensor drive signal. At other times, the second electrode (e.g., electrode 106) serves as a sensor input electrode, and the first electrode (e.g., electrode 104) serves as the sensor driver electrode. Due to the presence of certain materials (e.g., the liquid proof material 312), the liquid 404 does not directly contact the electrodes (e.g., electrodes 104 and 106). In contrast, the GND pattern of the sensor 102 (e.g., GND pattern 310) directly contacts any liquid 404 in the container 402.

With reference to FIG. 4A, the liquid level in the container 402 is considered to be 100% (e.g., full). The liquid 404 overlaps with 100% of a particular length of the electrodes 104 and 106 (e.g., see dotted line 410). Therefore, the particular lengths of the electrodes 104 and 106 are fully immersed in the liquid 404. The GND pattern of the sensor 102 (e.g., GND pattern 310) directly contacts the liquid 404. Therefore, the liquid 404 is at GND potential. A relatively poor dielectric (e.g., liquid 404) is located between the electrodes 104, 106. Therefore, the strength of the electric field between the electrodes 104, 106 is considered to be at a minimal level of 0%. Also, the capacitance of the capacitor that is formed by the electrodes 104, 106 is considered to be at a minimal level of 0%. As will be described in more detail later, the delta voltage that is output by an ADC (e.g., ADC of touch sensor 116) is at a maximum value.

With reference to FIG. 4B, the liquid level in the container 402 is considered to be 50% (e.g., half full). The liquid 404 coincides with 50% of the particular length of the electrodes 104 and 106 (e.g., see dotted line 412). Therefore, the particular lengths of the electrodes 104 and 106 are partially (50%) immersed in the liquid 404. The GND pattern of the sensor 102 (e.g., GND pattern 310) directly contacts the liquid 404. Therefore, the liquid 404 is at GND potential. The remaining portions of the electrodes 104, 106 overlap with air, which has a higher dielectric constant than the liquid 404. That is, air is a better dielectric than the liquid 404. Therefore, the strength of the electric field between the electrodes 104, 106 is considered to be at a medium level of 50%. Also, the capacitance of the capacitor that is formed by the electrodes 104, 106 is considered to be at a medium level of 50%. As will be described in more detail later, the delta voltage that is output by an ADC (e.g., ADC of touch sensor 116) is at a medium value.

With reference to FIG. 4C, the liquid level in the container is considered to be 0% (e.g., empty). No liquid overlaps with the particular length of the electrodes 104 and 106 (e.g., see dotted line 414). Therefore, the particular lengths of the electrodes 104 and 106 are not at all immersed in the liquid 404. Rather, the level of the liquid 404 does not reach the bottom of the electrodes 104 and 106. The GND pattern of the sensor 102 (e.g., GND pattern 310) directly contacts the liquid 404. Therefore, the liquid 404 is at GND potential. The electrodes 104 and 106 fully overlap with air, which is a better dielectric than the liquid 404. Therefore, the strength of the electric field between the electrodes 104 and 106 is considered to be at a maximum level of 100%. Also, the capacitance of the capacitor that is formed by the electrodes 104 and 106 is considered to be at a maximum level of 100%. As will be described in more detail later, the delta voltage output by an ADC (e.g., ADC of touch sensor 116) is at a minimum value.

In the scenarios of FIGS. 4A, 4B and 4C, the liquid level detection is not significantly influenced by parasitic capacitance, e.g., even if the lengths of cables (e.g., wires 112, 114) coupled to the electrodes 104, 106 are greater than or approximately equal to a particular length (e.g., 5 m). A more stable measurement can be taken, because the liquid 404 is at GND potential. The sensor 102 is configured for operation while placed inside a container. Accordingly, the sensor 102 may be used in various containers (e.g., containers of various shapes). A more accurate detection of the liquid level may be determined using an average of results from the 2-channel sensor. Also, adhesion of the dust in the liquid 404 may be reduced or prevented, by changing the direction of the electric field between the electrodes 104 and 106. This may be achieved by, for example, configuring the first electrode (e.g., electrode 104) as a sensor input electrode and the second electrode (e.g., electrode 106) as a sensor driver electrode during certain times, and, at other times, configuring the second electrode (e.g., electrode 106) as a sensor input electrode and the first electrode (e.g., electrode 104) as the sensor driver electrode.

Figure 5A:
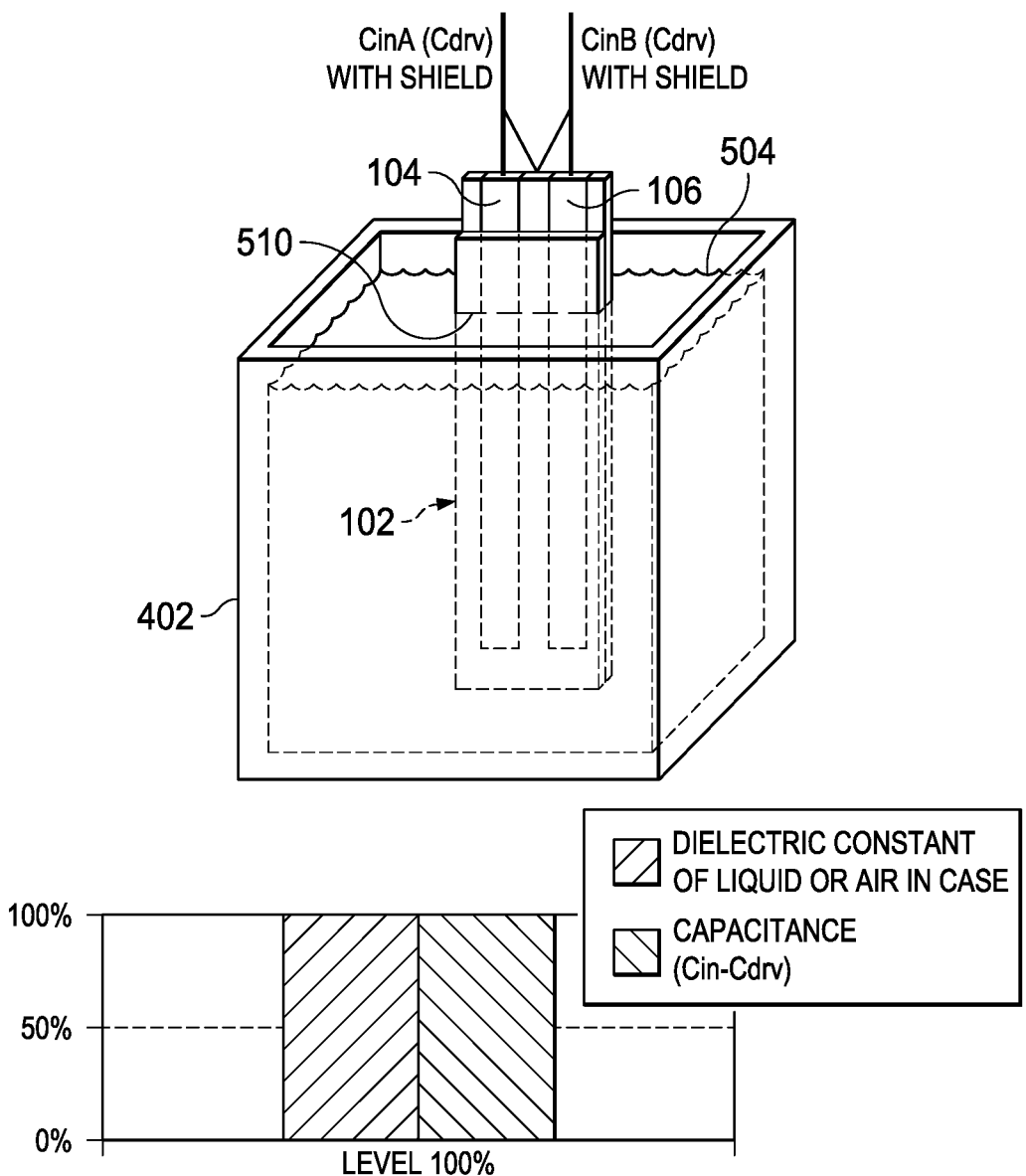
FIGS. 5A, 5B and 5C illustrate usage scenarios of the sensor according to at least one embodiment.
Figure 5B:
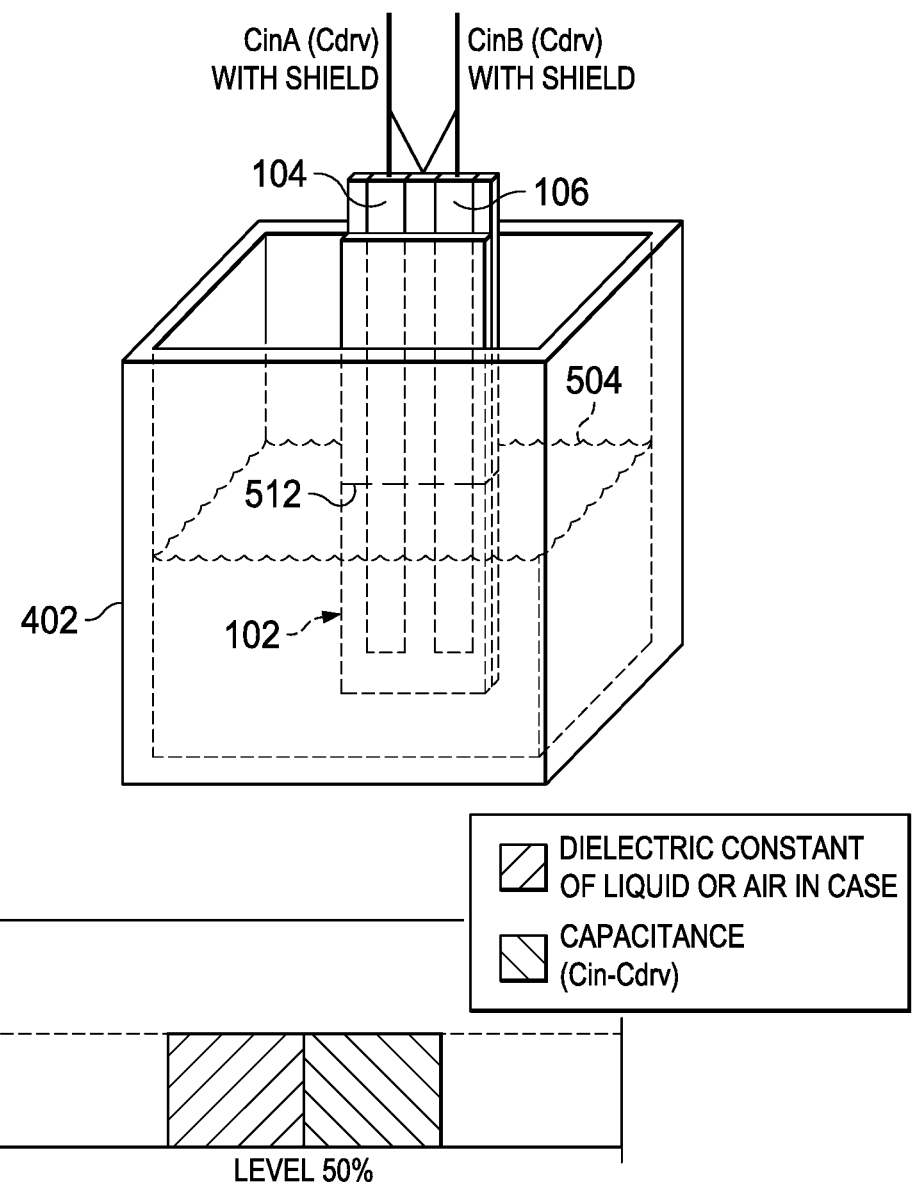
Figure 5C:
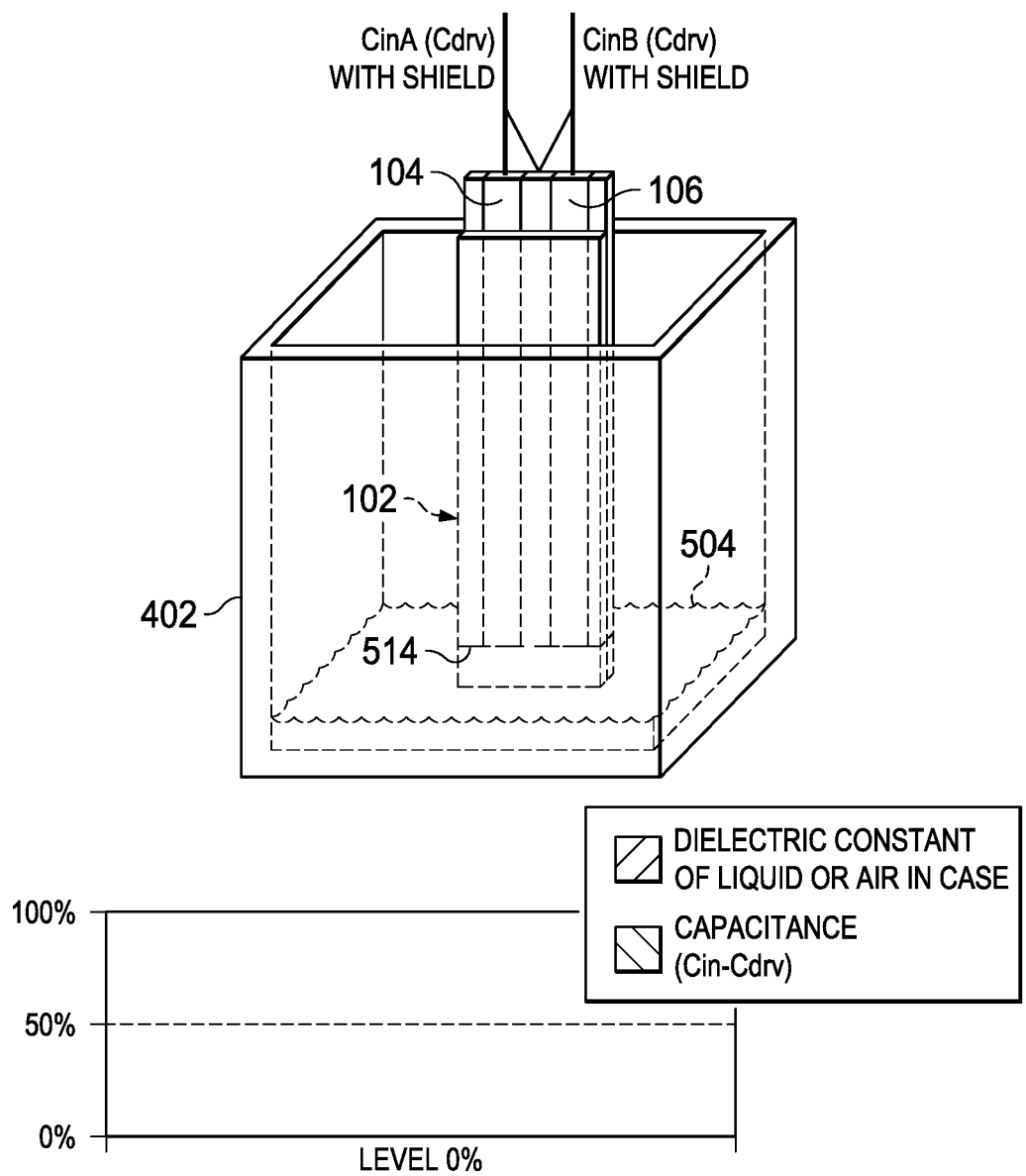

FIGS. 5A, 5B and 5C illustrate usage scenarios of the sensor 102 according to at least one embodiment. The configurations of the scenarios illustrated in FIGS. 5A, 5B and 5C are similar to the configurations of the scenarios described earlier with reference to FIGS. 4A, 4B and 4C, respectively. However, a notable difference is that the liquid 504 of FIGS. 5A, 5B and 5C has electrically insulating characteristics. For example, the liquid 504 has a higher dielectric constant than air. Because the liquid 504 has insulating characteristics, the liquid serves as an effective dielectric.

With reference to FIG. 5A, the liquid level in the container 402 is considered to be 100%. The liquid 504 overlaps with 100% of a particular length of the electrodes 104 and 106 (e.g., see dotted line 510). Therefore, the particular lengths of the electrodes 104 and 106 are fully immersed in the liquid 504. The GND pattern of the sensor 102 (e.g., GND pattern 310) directly contacts the liquid 504. However, because the liquid 504 has insulating characteristics, the voltage potential of the liquid 504 is not affected by this contact. A relatively good dielectric (e.g., liquid 504, which has a higher dielectric constant than air) is located between the electrodes 104 and 106. Therefore, the strength of the electric field between the electrodes 104 and 106 is considered to be at a maximum level of 100%. Also, the capacitance of the capacitor that is formed by the electrodes 104 and 106 is considered to be at a maximum level of 100%. As will be described in more detail later, the delta voltage output by an ADC (e.g., ADC of touch sensor 116) is at a maximum value.

With reference to FIG. 5B, the liquid level in the container 402 is considered to be 50% (e.g., half full). The liquid 504 coincides with 50% of the particular length of the electrodes 104 and 106 (e.g., see dotted line 512). Therefore, the particular lengths of the electrodes 104 and 106 are partially (50%) immersed in the liquid 504. The GND pattern of the sensor 102 (e.g., GND pattern 310) directly contacts the liquid 504. However, because the liquid 504 has insulating characteristics, the voltage potential of the liquid 504 is not affected by the contact. The remaining portions of the electrodes 104 and 106 overlap with air, which has a lower dielectric constant than the liquid 504. Air is a less effective dielectric than the liquid 504. Therefore, the strength of the electric field between the electrodes 104 and 106 is considered to be at a medium level of 50%. Also, the capacitance of the capacitor that is formed by the electrodes 104 and 106 is considered to be at a medium level of 50%. As will be described in more detail later, the delta voltage output by an ADC (e.g., ADC of touch sensor 116) is at a medium value.

With reference to FIG. 5C, the liquid level in the container is considered to be 0% (e.g., empty). No liquid overlaps with the particular length of the electrodes 104, 106 (e.g., see dotted line 514). Therefore, the particular lengths of the electrodes 104 and 106 are not at all immersed in the liquid 504. Rather, the level of the liquid 504 does not reach the bottom of the electrodes The GND pattern of the sensor 102 (e.g., GND pattern 310) directly contacts the liquid 504. However, because the liquid 504 has insulating characteristics, the voltage potential of the liquid 504 is not affected by the contact. The electrodes 104 and 106 fully overlap with air, which is a less effective dielectric than the liquid 504. Therefore, the strength of the electric field between the electrodes 104 and 106 is considered to be at a minimum level of 0%. Also, the capacitance of the capacitor that is formed by the electrodes 104 and 106 is considered to be at a minimum level of 0%. As will be described in more detail later, the delta voltage output by an ADC (e.g., ADC of touch sensor 116) is at a minimum value.

In the scenarios of FIGS. 5A, 5B and 5C, the liquid level detection is not significantly influenced by parasitic capacitance, even if the lengths of cables (e.g., wires 112, 114) coupled to the electrodes 104, 106 are greater than or approximately equal to a particular length (e.g., 5 m). A more stable measurement can be taken, even though the liquid 504 has electrically insulating characteristics.

Figure 6A:
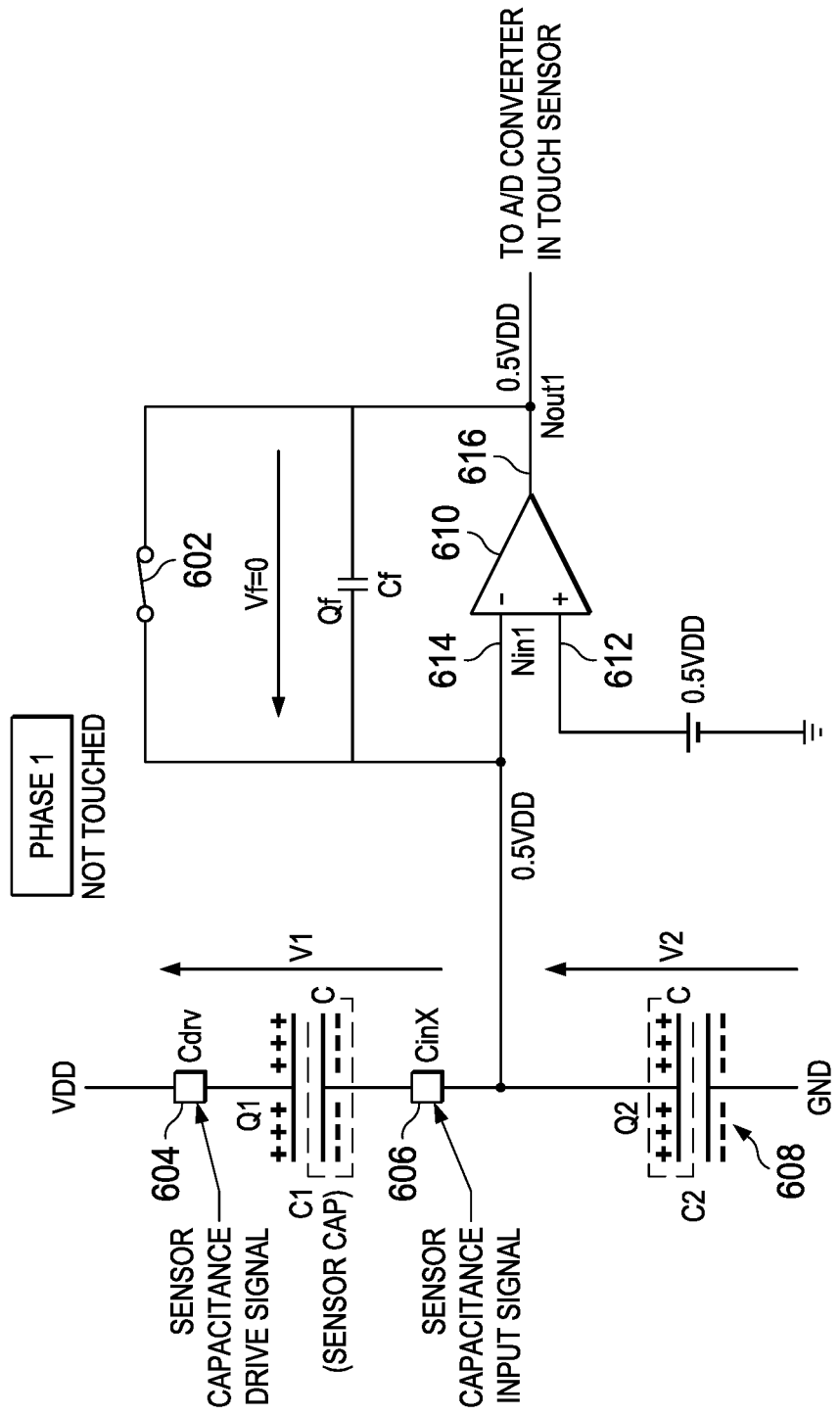
FIGS. 6A and 6B are circuit diagrams that illustrate operation of the sensor according to at least one embodiment.
Figure 6B:
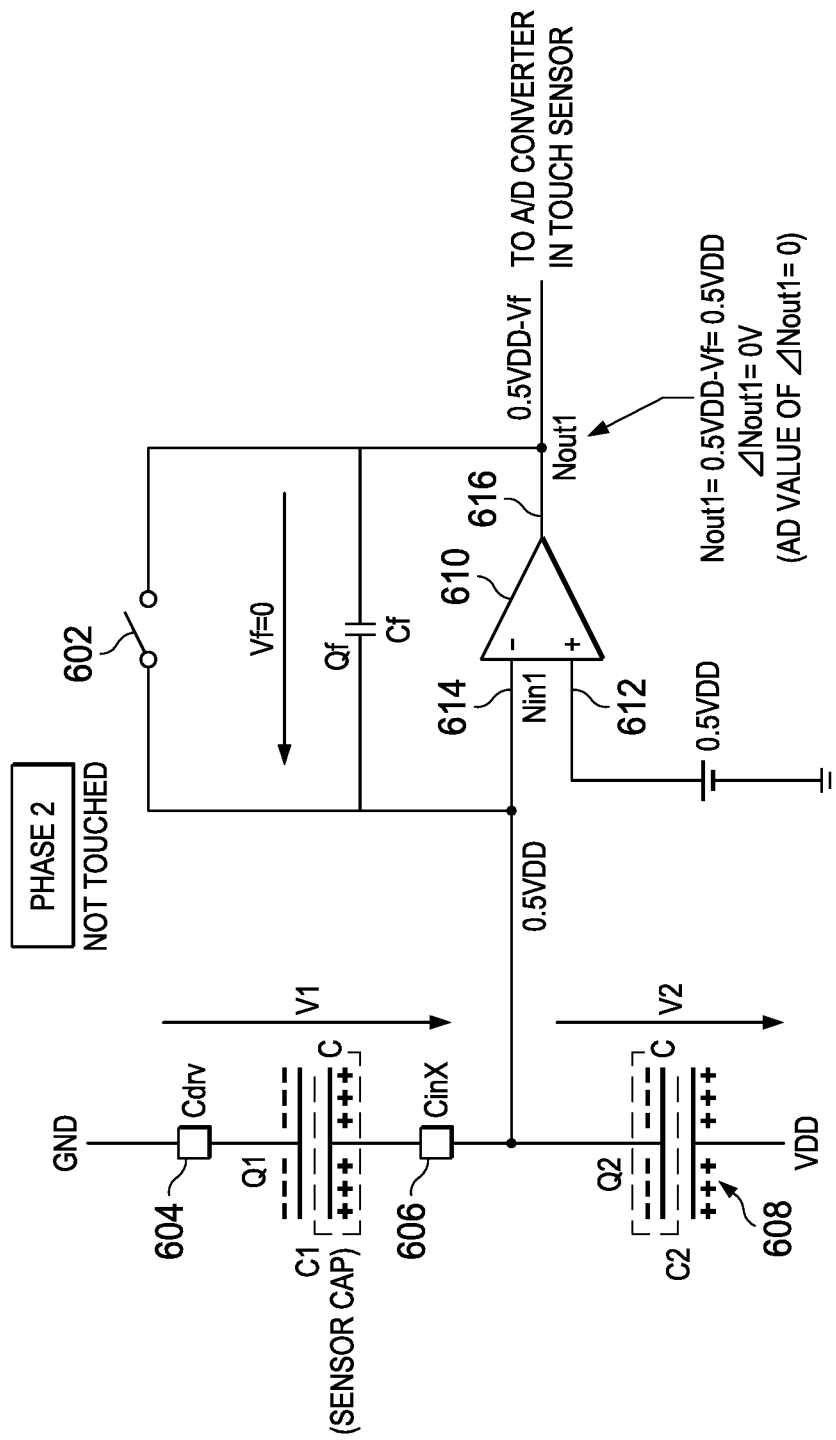

FIGS. 6A and 6B are circuit diagrams that illustrate operation of the sensor 102 according to at least one embodiment. The circuit diagrams of FIGS. 6A and 6B illustrate operation when the sensor 102, powered by a first supply voltage VSS and a second supply voltage VDD, is placed in a container that contains air. That is, the liquid level in the container is 0%. The operation will be described with reference to two phases of operation. During a first phase (see FIG. 6A), a switch 602 is turned on (the switch 602 is in a closed position). Also during the first phase, the second supply voltage VDD is coupled to a terminal 604 that is serving as the sensor driver node, and the first supply voltage VSS (e.g., GND) is coupled to a terminal 608 of a reference capacitor C2.

During a second phase (see FIG. 6B), the switch 602 is turned off (the switch 602 is in an open position). Also during the second phase, the second supply voltage VDD is coupled to the terminal 608 of reference capacitor C2, and the first supply voltage VSS (e.g., GND) is coupled to the terminal 604. During the second phase, an output from operational amplifier 610 (e.g., the delta voltage of sensor output voltage node Nout1) is used as a sensor result.

During both phases, a capacitor C1 is formed between the first electrode 104, which is attached to terminal 604, and the second electrode 106, which is attached to terminal 606. As noted earlier, the terminal 604 is serving as the sensor driver node. The terminal 606 is serving as the sensor input node (Nin1). The reference capacitor C2 provided within LSI touch sensor 116 can be changed by calibration. Accordingly, the capacitance of reference capacitor C2 can be set to be equal to the capacitance of capacitor C1 within sensor 102.

A non-inverting input terminal (input terminal 612) of an operational amplifier 610 is coupled to intermediate voltage 0.5*VDD. The inverting input terminal (input terminal 614) of the operational amplifier 610 is coupled to the terminal 606 (sensor input node Nin1). The output terminal 616 (sensor output voltage node Nout1) of the operational amplifier 610 is coupled to an A/D converter of a touch sensor (e.g., ADC of touch sensor 116).

Further, as shown in FIGS. 6A-6B, the operational amplifier's input terminal 614 and output terminal 616 are coupled by a feedback capacitor Cf and a switch 602. The switch 602 is operable to couple the operational amplifier's input terminal 614 to the output terminal 616. When the input terminal 614 and the output terminal 616 are coupled together in this way, the anode and cathode terminals of the feedback capacitor Cf are also coupled together.

Operation during the first phase will now be described in more detail with reference to FIG. 6A. It is understood that the LSI touch sensor 116 has performed calibration with air in the container. Accordingly, the capacitance of reference capacitor C2 is set equal to the capacitance of sensor capacitor C1.

As noted earlier, the switch 602 is in the closed position. Therefore, the operational amplifier's input terminal 614 and the output terminal 616 are coupled together. Further, the anode and the cathode of the feedback capacitor Cf are coupled together. As also noted earlier, second power supply voltage VDD is coupled to the terminal 604, and first power supply voltage VSS (e.g., GND) is coupled to a terminal 608 of C2.

Regarding the capacitor C1, positive charge is collected at the upper "plate" of the capacitor, and negative charge is collected at the lower "plate" of the capacitor. In the example of FIG. 6A, a charge of +6 is collected at the upper "plate" of the capacitor C1, and a charge of −6 is collected at the lower "plate" of the capacitor C1. Regarding the capacitor C2, a charge of +6 is collected at the upper "plate," and a charge of −6 is collected at the lower "plate." Because a charge of −6 is collected at the lower "plate" of C1 and a charge of +6 is collected at the upper "plate" of C2, the total electric charge at the terminal 606 is 0.

Because the capacitances of C1 and C2 are equal to each other, a voltage of 0.5*VDD is input to the input terminal 614. The switch 602 is in the closed position. Accordingly, the potential at the output terminal 616 is also 0.5*VDD.

After operation in the first phase, operation in the second phase is performed.

Operation during the second phase will now be described in more detail with reference to FIG. 6B. As noted earlier, the switch 602 is in the open position. Therefore, the operational amplifier's input terminal 614 and the output terminal 616 are no longer coupled together via the switch 602. Also, the anode and the cathode of the feedback capacitor Cf are no longer coupled together. As also noted earlier, VSS (e.g., GND) is coupled to the terminal 604, and VDD is coupled to the terminal 608 of C2.

Regarding the capacitor C2, positive charge is collected at the lower "plate" of the capacitor, and negative charge is collected at the upper "plate" of the capacitor. In the example of FIG. 6B, a charge of +6 is collected at the lower "plate" of the capacitor C2, and a charge of −6 is collected at the upper "plate" of the capacitor C2. Regarding the capacitor C1, a charge of +6 is collected at the lower "plate," and a charge of −6 is collected at the upper "plate." The total electric charge at the terminal 606 remains 0, as it was during the operation in the first phase (see FIG. 6A). This total electric charge is consistent with the charge of −6 being present at the upper "plate" of C2 and the charge of +6 being present at the lower "plate" of C1.

The voltage at the output terminal 616 is equal to (0.5*VDD) minus the voltage Vf across the capacitor Cf. As noted earlier, the total electric charge at the terminal 606 is 0. Therefore, the charge at the leftmost "plate" of Cf is also 0, and the voltage Vf is equal to 0. Therefore, the voltage at the output terminal 616 is equal to 0.5*VDD.

Figure 7A:
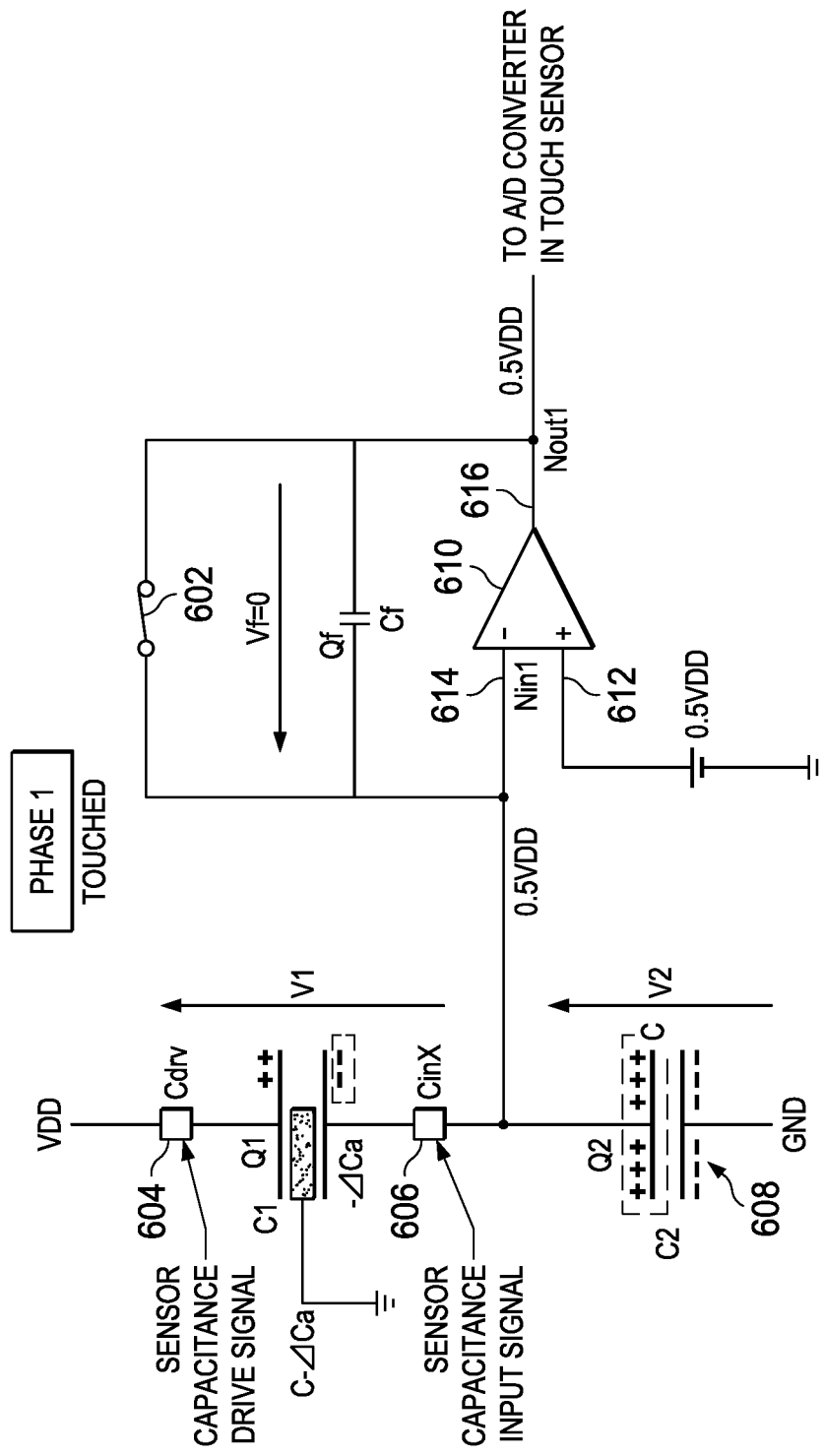
FIGS. 7A and 7B are circuit diagrams that illustrate operation of the sensor according to at least one embodiment.
Figure 7B:
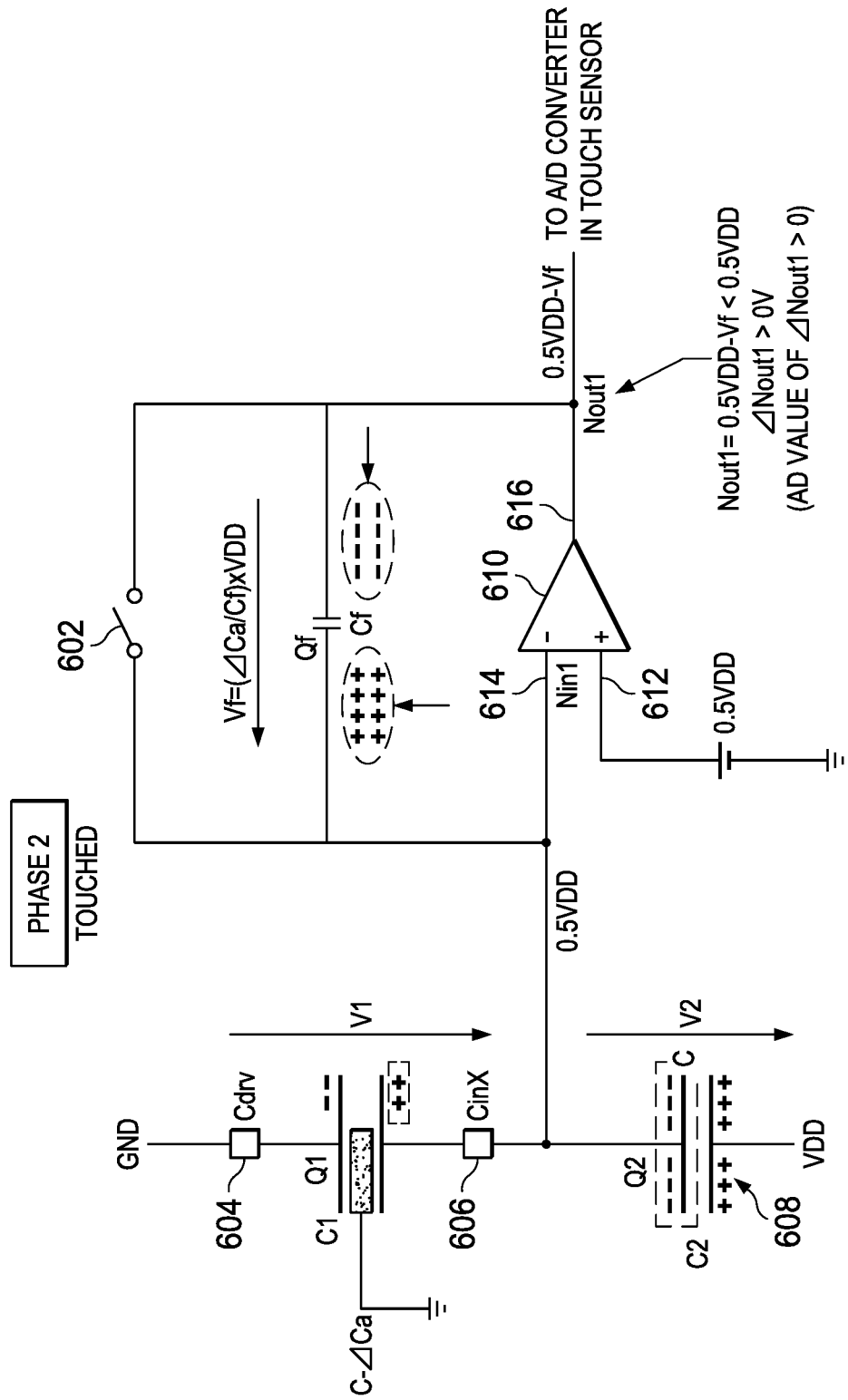

FIGS. 7A and 7B are circuit diagrams that illustrate operation of the sensor 102 according to at least one embodiment. The circuit diagrams of FIGS. 7A and 7B illustrate operation when the sensor 102 is placed in a container that contains a liquid that has electrically conductive (or semi-conductive) characteristics. The operation will be described with reference to two phases of operation. During a first phase (see FIG. 7A), the switch 602 is turned on (the switch is in a closed position). Also during the first phase, VDD is coupled to the terminal 604 that is serving as the sensor driver terminal, and VSS (e.g., GND) is coupled to the terminal 608.

During the second phase (see FIG. 7B), the switch 602 is turned off (the switch 602 is in an open position). Also during the second phase, VDD is coupled to the terminal 608, and VSS (e.g., GND) is coupled to the terminal 604.

As described earlier with reference to FIGS. 4A, 4B and 4C, the capacitance of C1 increases as the level of the liquid in the container decreases. For example, the capacitance of C1 at the time that the level of the liquid is 100% is less than the capacitance of C1 at the time that the level of the liquid is 50%. As another example, the capacitance of C1 at the time that the level of the liquid is 50% is less than the capacitance of C1 at the time that the level of the liquid is 0%.

In the examples of FIGS. 7A and 7B, the level of the liquid in the container is non-zero (greater than 0%). Accordingly, the capacitance of C1 in the examples of FIGS. 7A and 7B is less than the capacitance of C1 at the time that the level of the liquid is 0%. Assuming that the capacitance of C1 is equal to C when the level of the liquid is 0%, the capacitance of C1 in the examples of FIGS. 7A and 7B is equal to C−ΔCa, where ΔCa is >0.

The input terminal 612 is coupled to 0.5*VDD. The input terminal 614 is coupled to the terminal 606. The output terminal 616 is coupled to an A/D converter in the touch sensor (e.g., ADC of touch sensor 116).

Operation during the first phase will now be described in more detail with reference to FIG. 7A.

Regarding the capacitor C1, positive charge is collected at the upper "plate" of the capacitor, and negative charge is collected at the lower "plate" of the capacitor. Due to the presence of the conductive liquid between the terminals 604 and 606, the amount of charge that is collected on the "plates" of C1 is reduced. In the example of FIG. 7A, a charge of +2 is collected at the upper "plate" of the capacitor C1, and a charge of −2 is collected at the lower "plate" of the capacitor C1. Regarding the capacitor C2, a charge of +6 is collected at the upper "plate" of the capacitor, and a charge of −6 is collected at the lower "plate" of the capacitor. Because a charge of −2 is collected at the lower "plate" of C1 and a charge of +6 is collected at the upper "plate" of C2, the total electric charge at the terminal 606 is +4.

A voltage of 0.5*VDD is input to the input terminal 614. The switch 602 is in the closed position. Accordingly, the potential at the output terminal 616 is also 0.5*VDD.

After operation in the first phase, operation in the second phase is performed.

Operation during the second phase will now be described in more detail with reference to FIG. 7B.

Regarding the capacitor C2, positive charge is collected at the lower "plate" of the capacitor, and negative charge is collected at the upper "plate" of the capacitor. In the example of FIG. 7B, a charge of +6 is collected at the lower "plate" of the capacitor C2, and a charge of −6 is collected at the upper "plate" of the capacitor C2. Regarding the capacitor C1, a charge of +2 is collected at the lower "plate" of the capacitor, and a charge of −2 is collected at the upper "plate" of the capacitor. The total electric charge at the terminal 606 remains +4, as it was during the operation in the first phase, consistent with the rule of the electric charge uniformity. Accordingly, a charge of +8 is collected at the leftmost "plate" of the capacitor Cf. The sum of +8 (the charge at the leftmost "plate" of Cf) and +2 (the charge at the lower "plate" of C1) and −6 (the charge at the upper "plate" of C2) equals +4, which is the total electric charge at the terminal 606.

The voltage at the output terminal 616 is equal to (0.5*VDD) minus the voltage Vf that is across the capacitor Cf. As noted earlier, a charge of +8 is collected at the leftmost "plate" of the capacitor Cf. Therefore, the charge at the rightmost "plate" of Cf is −8. The voltage Vf is equal to (ΔCa/Cf)*VDD. The voltage at the output terminal 616 is equal to (0.5*VDD−Vf), the value of which is less than 0.5*VDD.

Figure 8A:
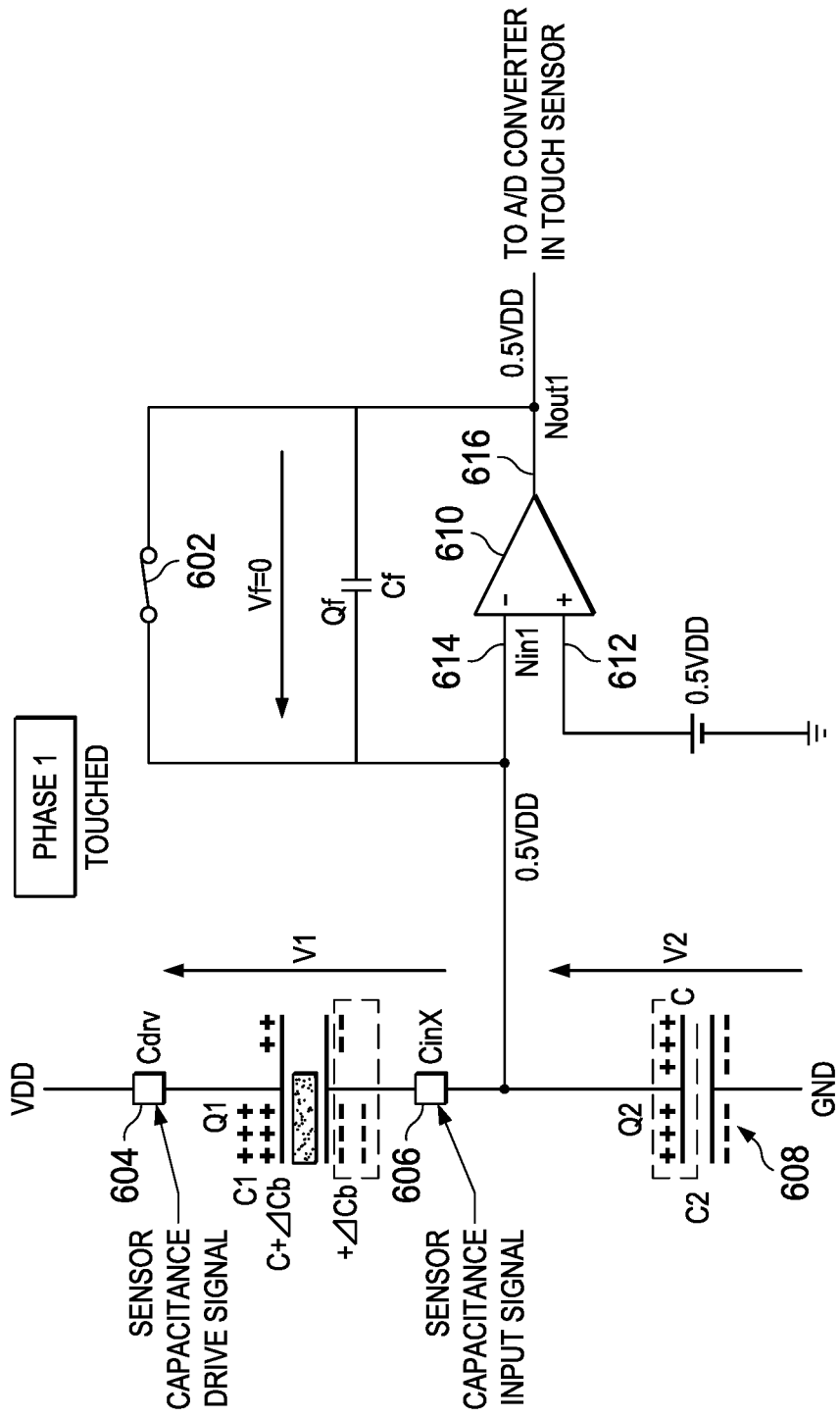
FIGS. 8A and 8B are circuit diagrams that illustrate operation of the sensor according to at least one embodiment.
Figure 8B:
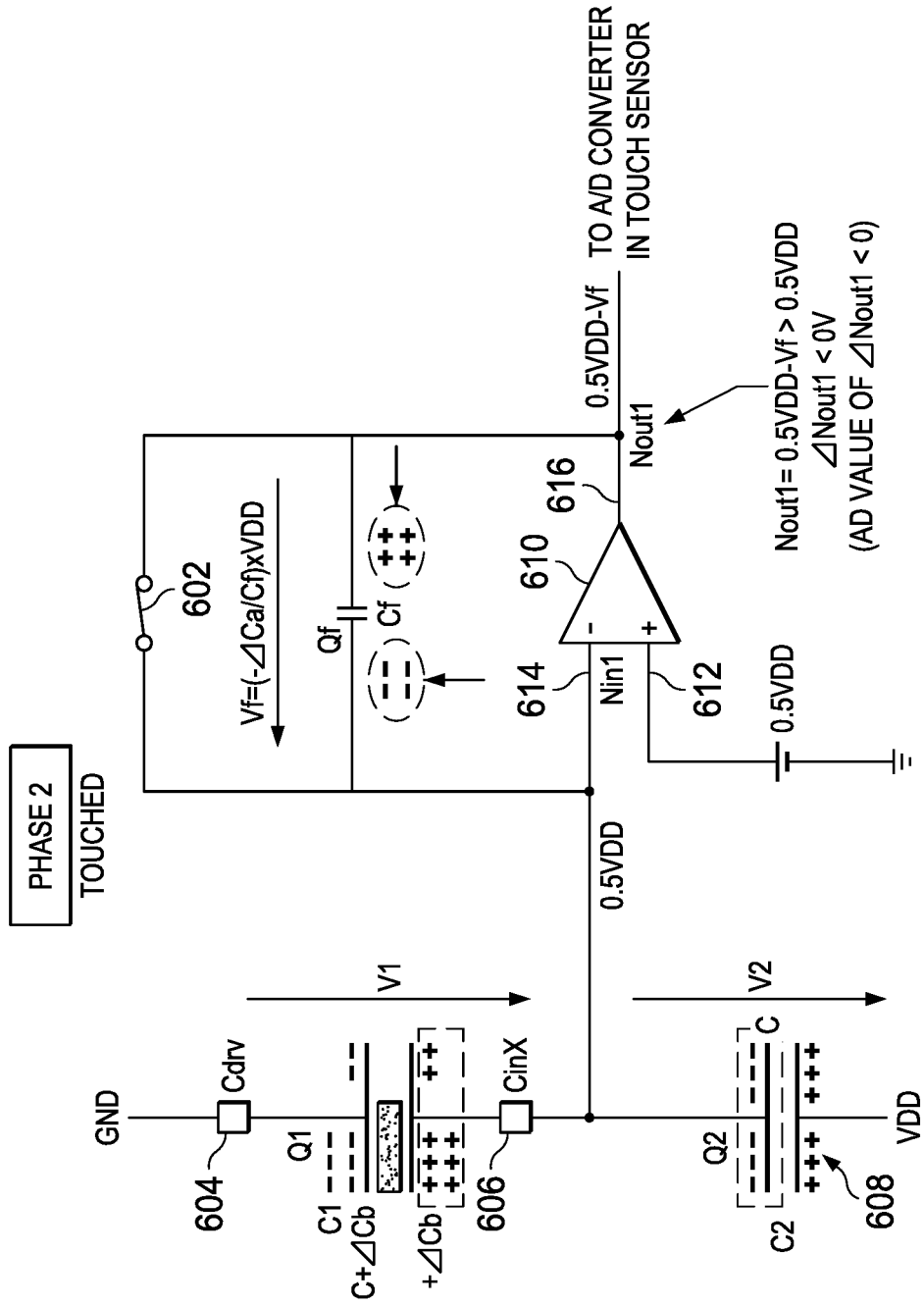

FIGS. 8A and 8B are circuit diagrams that illustrate operation of the sensor 102 according to at least one embodiment. The circuit diagrams of FIGS. 8A and 8B illustrate operation when the sensor 102 is placed in a container that contains a liquid that has electrically insulating characteristics.

The operation will be described with reference to two phases of operation. During a first phase (see FIG. 8A), the switch 602 is turned on (the switch is in a closed position). Also during the first phase, VDD is coupled to the terminal 604 that is serving as the sensor driver terminal, and VSS (e.g., GND) is coupled to the terminal 608.

During the second phase (see FIG. 8B), the switch 602 is turned off (the switch is in an open position). Also during the second phase, VDD is coupled to the terminal 608, and VSS (e.g., GND) is coupled to the terminal 604.

As described earlier with reference to FIGS. 5A, 5B and 5C, the capacitance of C1 decreases as the level of the liquid in the container decreases. For example, the capacitance of C1 at the time that the level of the liquid is 100% is greater than the capacitance of C1 at the time that the level of the liquid is 50%. As another example, the capacitance of C1 at the time that the level of the liquid is 50% is greater than the capacitance of C1 at the time that the level of the liquid is 0%.

In the examples of FIGS. 8A and 8B, the level of the liquid in the container is non-zero (greater than 0%). Accordingly, the capacitance of C1 in the examples of FIGS. 8A and 8B is greater than the capacitance of C1 at the time that the level of the liquid is 0%. Assuming that the capacitance of C1 is equal to C at the time that the level of the liquid is 0%, the capacitance of C1 in the examples of FIGS. 8A and 8B is equal to C+ΔCb, where ΔCb is >0.

The input terminal 612 is coupled to 0.5*VDD. The input terminal 614 is coupled to the terminal 606. The output terminal 616 is coupled to an A/D converter in the touch sensor (e.g., ADC of touch sensor 116).

Operation during the first phase will now be described in more detail with reference to FIG. 8A.

Regarding the capacitor C1, positive charge is collected at the upper "plate" of the capacitor, and negative charge is collected at the lower "plate" of the capacitor. Due to the presence of the insulating liquid between the terminals 604 and 606, the amount of charge that is collected on the plates of C1 is increased. In the example of FIG. 8A, a charge of +8 is collected at the upper "plate" of the capacitor C1, and a charge of −8 is collected at the lower "plate" of the capacitor C1. Regarding the capacitor C2, a charge of +6 is collected at the upper "plate" of the capacitor, and a charge of −6 is collected at the lower "plate" of the capacitor. Because a charge of −8 is collected at the lower "plate" of C1 and a charge of +6 is collected at the upper "plate" of C2, the total electric charge at the terminal 606 is −2.

A voltage of 0.5*VDD is input to the input terminal 614. The switch 602 is in the closed position. Accordingly, the potential at the output terminal 616 is also 0.5*VDD.

After operation in the first phase, operated in the second phase is performed.

Operation during the second phase will now be described in more detail with reference to FIG. 8B.

Regarding the capacitor C2, positive charge is collected at the lower "plate" of the capacitor, and negative charge is collected at the upper "plate" of the capacitor. In the example of FIG. 8B, a charge of +6 is collected at the lower "plate" of the capacitor C2, and a charge of −6 is collected at the upper "plate" of the capacitor C2. Regarding the capacitor C1, a charge of +8 is collected at the lower "plate" of the capacitor, and a charge of −8 is collected at the upper "plate" of the capacitor. The total electric charge at the terminal 606 remains −2, as it was during the operation in the first phase, consistent with the rule of the electric charge uniformity. Accordingly, a charge of −4 is collected at the leftmost "plate" of the capacitor Cf. The sum of −4 (the charge at the leftmost "plate" of Cf) and −6 (the charge at the upper "plate" of C2) and +8 (the charge at the lower "plate" of C1) equals −2, which is the total electric charge at the terminal 606.

The voltage at the output terminal 616 is equal to (0.5*VDD) minus the voltage Vf that is across the capacitor Cf. As noted earlier, a charge of −4 is collected at the leftmost "plate" of the capacitor Cf. Therefore, the charge at the rightmost "plate" of Cf is +4. The voltage Vf is equal to (−ΔCb/Cf)*VDD. The voltage at the output terminal 616 is equal to (0.5*VDD−Vf), the result of which is greater than 0.5*VDD.

In the examples of FIGS. 6A and 6B, FIGS. 7A and 7B, and FIGS. 8A and 8B, terminals 604 and 606 were referenced. Terminal 604 corresponds to the sensor driver terminal, and terminal 606 corresponds to the sensor input terminal. According to at least one embodiment, a particular electrode (e.g., electrode 104) may serve as the sensor driver terminal at a particular time. In this situation, the other electrode (e.g., electrode 106) serves as the sensor input terminal. At another time, the particular electrode (e.g., electrode 104) may serve as the sensor input terminal. In this situation, the other electrode (e.g., electrode 106) serves as the sensor driver terminal.

In one example sequence, electrode 104 serves as the sensor input terminal, and electrode 106 serves as the sensor driver electrode. Under this configuration, the operations of a first phrase are performed, and then the operations of a second phase are performed. The operations of the second phase include the taking or recording of a measurement. Then, the functions of the electrodes 104 and 106 are switched (or reversed). Accordingly, the electrode 104 serves as the sensor driver terminal, and electrode 106 serves as the sensor input electrode. Under this configuration, the operations of the first phase are performed, and then the operations of the second phase are performed. The operations of the second phase include the taking or recording of a measurement.

Figure 9A:
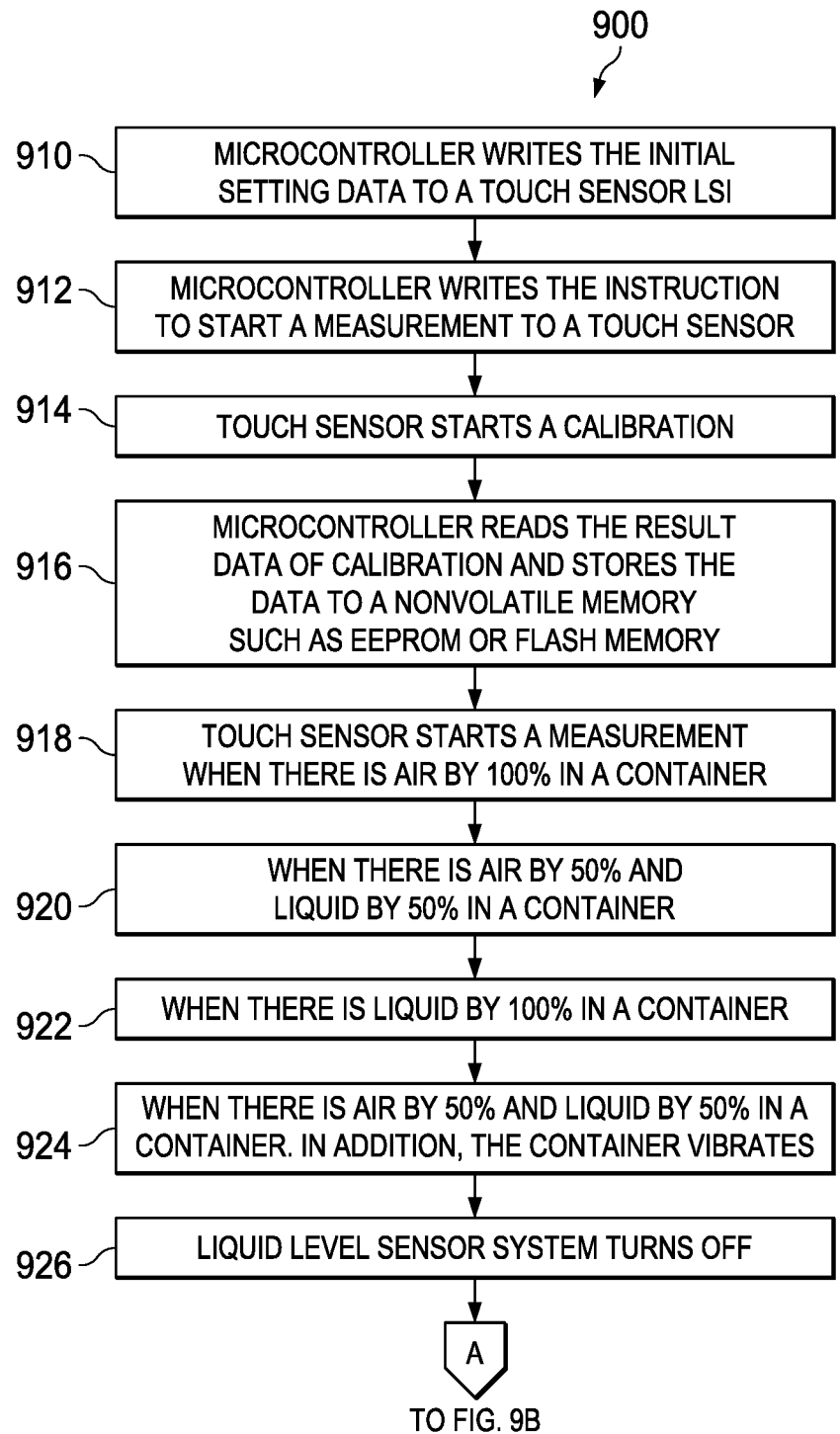
FIGS. 9A and 9B are a flowchart of a liquid level detection method according to at least one embodiment.
Figure 9B:
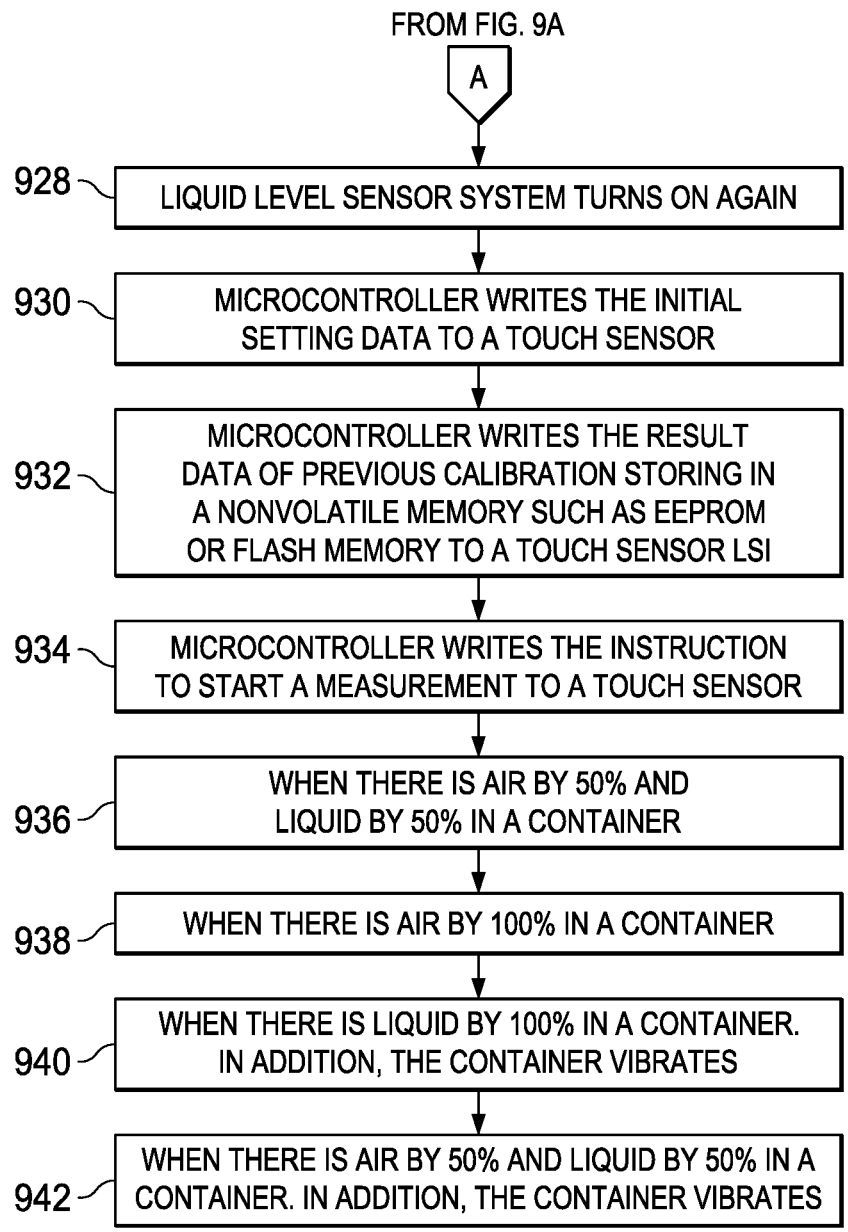

FIGS. 9A and 9B are a flowchart 900 of a liquid level detection method according to at least one embodiment. The level detected is of a liquid that has conductive (or semiconductive) characteristics. Various scenarios will be described with reference to the flowchart 900.

With reference to FIG. 9A, at box 910, a microcontroller (e.g., microcontroller 118) writes initial setting data to a touch sensor (e.g., touch sensor 116). The initial setting data may control configurations of multiple electrodes (e.g., electrodes 104, 106). If a first electrode (e.g., electrode 104) serves as the sensor input terminal, then a second electrode (e.g., electrode 106) serves as the sensor driver terminal. If the first electrode (e.g., electrode 104) serves as the sensor driver terminal, then the second electrode (e.g., electrode 106) serves as the sensor input terminal.

At box 912, the microcontroller initiates a measurement to be performed. For example, the microcontroller writes an instruction to start a measurement. The instruction is sent to a touch sensor. At box 914, the touch sensor starts a calibration. At box 916, the microcontroller reads the result data of calibration and stores the data in a nonvolatile memory such as an EEPROM or a flash memory. The nonvolatile memory may be an external component, or it may be internal to the microcontroller or the touch sensor.

At box 918, the touch sensor performs measurements. Here, the level of liquid in the container is 0% (e.g., empty) (see, e.g., FIG. 4C). First, the first electrode (e.g., electrode 104) serves as the sensor input terminal. As such, the second electrode (e.g., electrode 106) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

Next, the second electrode (e.g., electrode 106) serves as the sensor input terminal. As such, the first electrode (e.g., electrode 104) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

At box 920, the touch sensor performs measurements. Here, the level of liquid in the container is 50% (e.g., half full) (see, e.g., FIG. 4B). First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 50.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 50.

At box 922, the touch sensor performs measurements. Here, the level of liquid in the container is 100% (e.g., full) (see, e.g., FIG. 4A). First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 100.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 100.

At box 924, the touch sensor performs measurements. Here, the level of liquid in the container is 50% (e.g., half full) (see, e.g., FIG. 4B). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 48.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 52. Because there is a difference in the values output by the ADC, an average of the values (e.g., 52 and 48) may be determined. In this situation, the average value is equal to 50.

At box 926, the liquid level detection system is turned off.

Discussion of the flowchart 900 continues with reference to FIG. 9B.

At box 928, the liquid level detection system is turned on. At box 930, the microcontroller writes initial setting data to a touch sensor. The initial setting data may control configurations of multiple electrodes (e.g., electrodes 104, 106). If a first electrode (e.g., electrode 104) serves as the sensor input terminal, then a second electrode (e.g., electrode 106) serves as the sensor driver terminal. If the first electrode (e.g., electrode 104) serves as the sensor driver terminal, then the second electrode (e.g., electrode 106) serves as the sensor input terminal.

At box 932, the microcontroller may write the results of a previous calibration(s) (see, e.g., box 916) and store the data in a nonvolatile memory such as an EEPROM or a flash memory. The nonvolatile memory may be an external component, or it may be internal to the microcontroller or the touch sensor.

At box 934, the microcontroller initiates a measurement to be performed. For example, the microcontroller writes an instruction to start a measurement. The instruction is sent to a touch sensor.

At box 936, the touch sensor performs measurements. Here, the level of liquid in the container is 50% (e.g., half full) (see, e.g., FIG. 4B). First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 50.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 50.

At box 938, the touch sensor performs measurements. Here, the level of liquid in the container is 0% (e.g., empty) (see, e.g., FIG. 4C). First, the first electrode (e.g., electrode 104) serves as the sensor input terminal. As such, the second electrode (e.g., electrode 106) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

Next, the second electrode (e.g., electrode 106) serves as the sensor input terminal. As such, the first electrode (e.g., electrode 104) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

At box 940, the touch sensor performs measurements. Here, the level of liquid in the container is 100% (e.g., full) (see, e.g., FIG. 4A). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 102.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 98. Because there is a difference in the values output by the ADC, an average of the values (e.g., 102 and 98) may be determined. In this situation, the average value is equal to 100.

At box 942, the touch sensor performs measurements. Here, the level of liquid in the container is 50% (e.g., half full) (see, e.g., FIG. 4B). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 49.

Next, the second electrode (e.g., electrode 106) serves as the sensor input terminal. As such, the first electrode (e.g., electrode 104) serves as the sensor drive terminal. Operations of a first phase are performed (see, e.g., FIG. 7A). Then operations of a second phase are performed (see, e.g., FIG. 7B). A measurement (e.g., output at the output terminal 616) is taken. A delta voltage that is output by an ADC (e.g., ADC of touch sensor 116) is equal to 51. Because there is a difference in the values output by the ADC, an average of the values (e.g., 49 and 51) may be determined. In this situation, the average value is equal to 50.

Figure 10A:
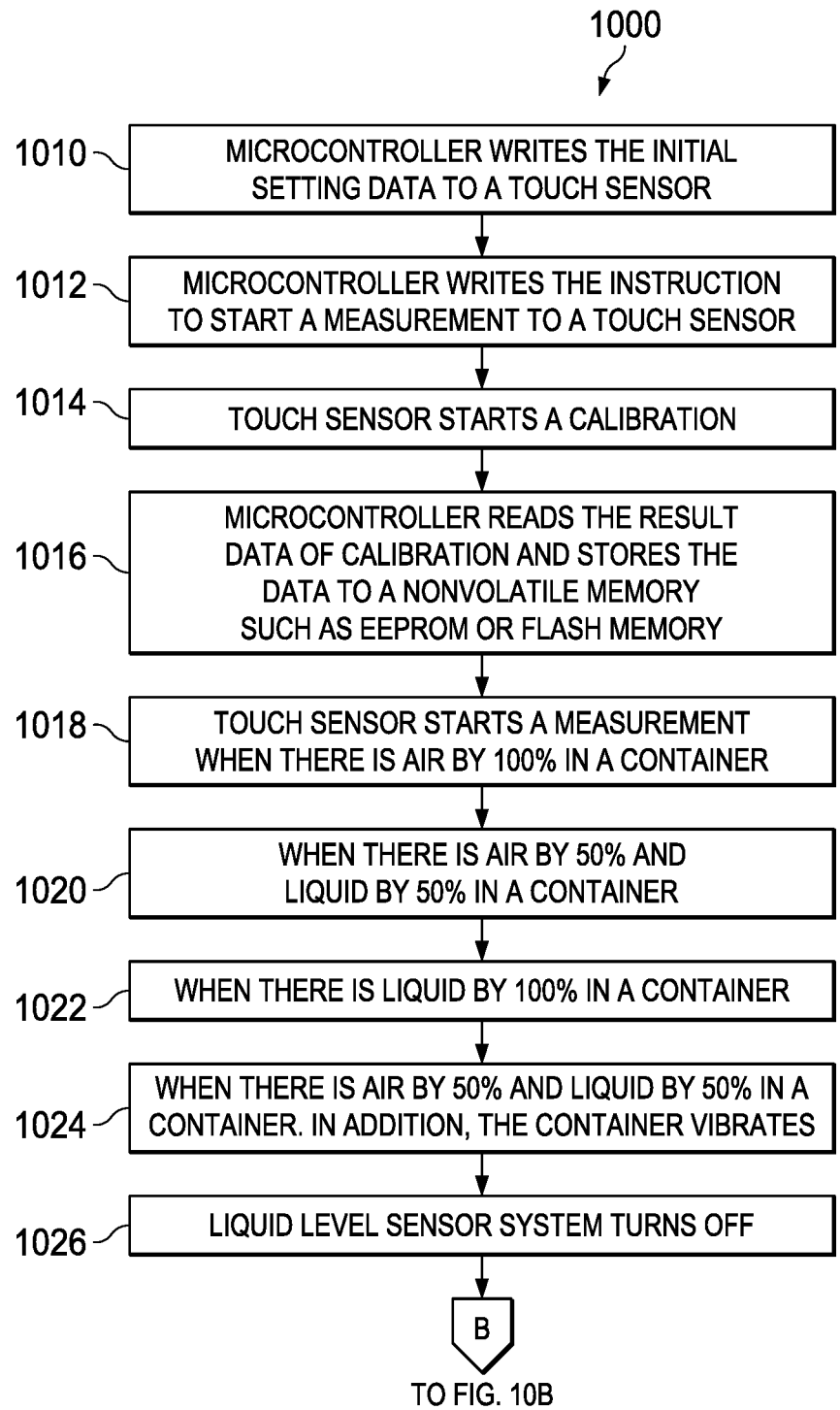
FIGS. 10A and 10B are a flowchart of a liquid level detection method according to at least one embodiment.
Figure 10B:
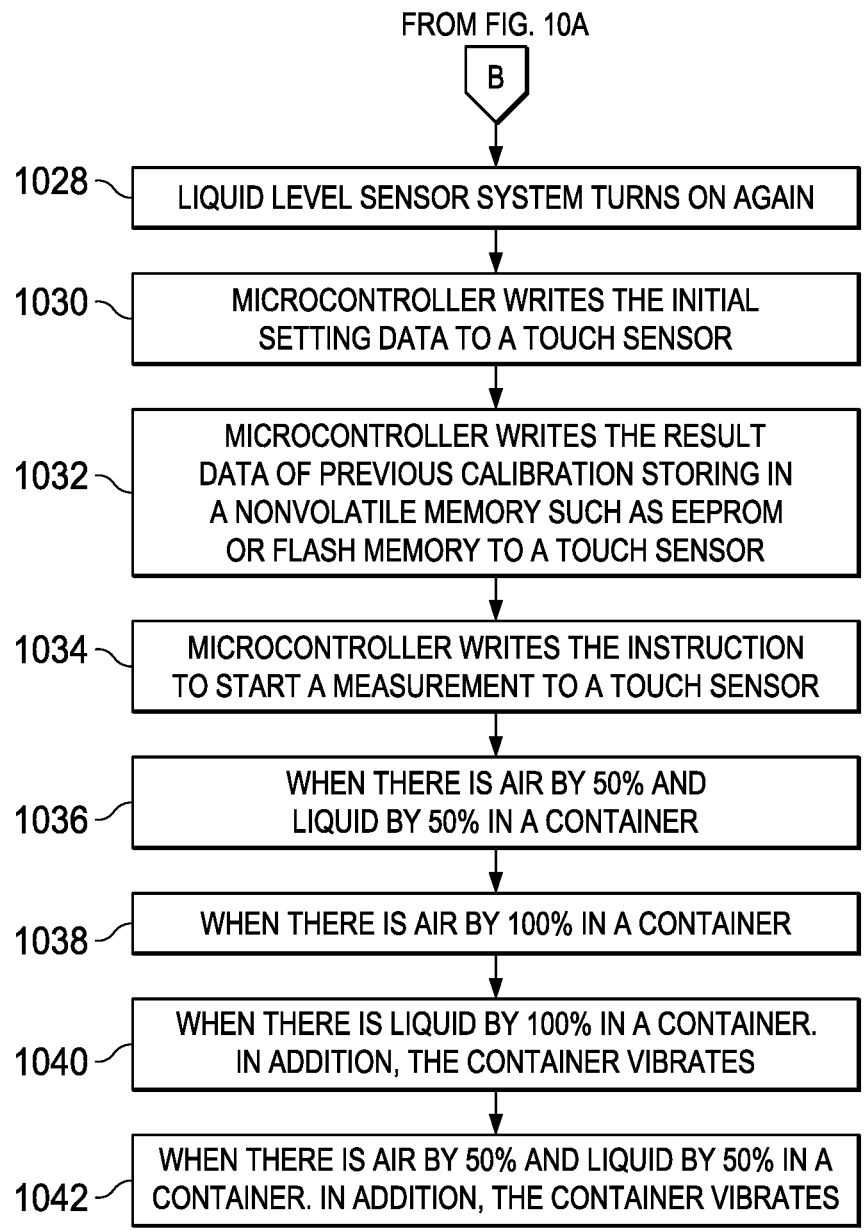

FIGS. 10A and 10B are a flowchart 1000 of a liquid level detection method according to at least one embodiment. The level detected is of a liquid that has electrically insulating characteristics. Various scenarios will be described with reference to the flowchart 1000.

With reference to FIG. 10A, at box 1010, a microcontroller (e.g., microcontroller 118) writes initial setting data to a touch sensor (e.g., touch sensor 116). The initial setting data may control configurations of multiple electrodes (e.g., electrodes 104, 106). If a first electrode (e.g., electrode 104) serves as the sensor input terminal, then a second electrode (e.g., electrode 106) serves as the sensor driver terminal. If the first electrode (e.g., electrode 104) serves as the sensor driver terminal, then the second electrode (e.g., electrode 106) serves as the sensor input terminal.

At box 1012, the microcontroller initiates a measurement to be performed. For example, the microcontroller writes an instruction to start a measurement. The instruction is sent to a touch sensor. At box 1014, the touch sensor starts a calibration. At box 1016, the microcontroller reads the result data of calibration and stores the data in a nonvolatile memory such as an EEPROM or a flash memory. The nonvolatile memory may be an external component, or it may be internal to the microcontroller or the touch sensor.

At box 1018, the touch sensor performs measurements. Here, the level of liquid in the container is 0% (e.g., empty) (see, e.g., FIG. 5C). First, the first electrode (e.g., electrode 104) serves as the sensor input terminal. As such, the second electrode (e.g., electrode 106) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

Next, the second electrode (e.g., electrode 106) serves as the sensor input terminal. As such, the first electrode (e.g., electrode 104) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

At box 1020, the touch sensor performs measurements. Here, the level of liquid in the container is 50% (e.g., half full) (see, e.g., FIG. 5B). First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −50.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −50.

At box 1022, the touch sensor performs measurements. Here, the level of liquid in the container is 100% (e.g., full) (see, e.g., FIG. 5A). First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −100.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −100.

At box 1024, the touch sensor performs measurements. Here, the level of liquid in the container is 50% (e.g., half full) (see, e.g., FIG. 5B). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −48.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −52. Because there is a difference in the values output by the ADC, an average of the values (e.g., −52 and −48) may be determined. In this situation, the average value is equal to −50.

At box 1026, the liquid level detection system is turned off.

Discussion of the flowchart 1000 continues with reference to FIG. 10B.

At box 1028, the liquid level detection system is turned on. At box 1030, the microcontroller writes initial setting data to a touch sensor. The initial setting data may control configurations of multiple electrodes (e.g., electrodes 104, 106). If a first electrode (e.g., electrode 104) serves as the sensor input terminal, then a second electrode (e.g., electrode 106) serves as the sensor driver terminal. If the first electrode (e.g., electrode 104) serves as the sensor driver terminal, then the second electrode (e.g., electrode 106) serves as the sensor input terminal.

At box 1032, the microcontroller may write the results of a previous calibration(s) (see, e.g., box 1016) and store the data in a nonvolatile memory such as an EEPROM or a flash memory. The nonvolatile memory may be an external component, or it may be internal to the microcontroller or the touch sensor.

At box 1034, the microcontroller initiates a measurement to be performed. For example, the microcontroller writes an instruction to start a measurement. The instruction is sent to a touch sensor.

At box 1036, the touch sensor performs measurements. Here, the level of liquid in the container is 50% (e.g., half full) (see, e.g., FIG. 5B). First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −50.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −50.

At box 1038, the touch sensor performs measurements. Here, the level of liquid in the container is 0% (e.g., empty) (see, e.g., FIG. 5C). First, the first electrode (e.g., electrode 104) serves as the sensor input terminal. As such, the second electrode (e.g., electrode 106) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

Next, the second electrode (e.g., electrode 106) serves as the sensor input terminal. As such, the first electrode (e.g., electrode 104) serves as the sensor drive terminal. Operations of a first phase are performed (see, e.g., FIG. 6A). Then operations of a second phase are performed (see, e.g., FIG. 6B). A measurement (e.g., output at the output terminal 616) is taken. A delta voltage that is output by an ADC (e.g., ADC of touch sensor 116) is equal to 0.

At box 1040, the touch sensor performs measurements. Here, the level of liquid in the container is 100% (e.g., full) (see, e.g., FIG. 5A). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −102.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −98. Because there is a difference in the values output by the ADC, an average of the values (e.g., −102 and −98) may be determined. In this situation, the average value is equal to −100.

At box 1042, the touch sensor performs measurements. Here, the level of liquid in the container is 50% (e.g., half full) (see, e.g., FIG. 5B). The container vibrates (or is caused to vibrate). Due to the vibration, the surface of the liquid may not remain static, and measurements that are taken may vary. First, the first electrode (e.g., electrode 104) serves as the sensor input terminal. As such, the second electrode (e.g., electrode 106) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −49.

Next, the second electrode (e.g., electrode 106) serves as the sensor input terminal. As such, the first electrode (e.g., electrode 104) serves as the sensor drive terminal. Operations of a first phase are performed (see, e.g., FIG. 8A). Then operations of a second phase are performed (see, e.g., FIG. 8B). A measurement (e.g., output at the output terminal 616) is taken. A delta voltage that is output by an ADC (e.g., ADC of touch sensor 116) is equal to −51. Because there is a difference in the values output by the ADC, an average of the values (e.g., −49 and −51) may be determined. In this situation, the average value is equal to −50.

Figure 11:
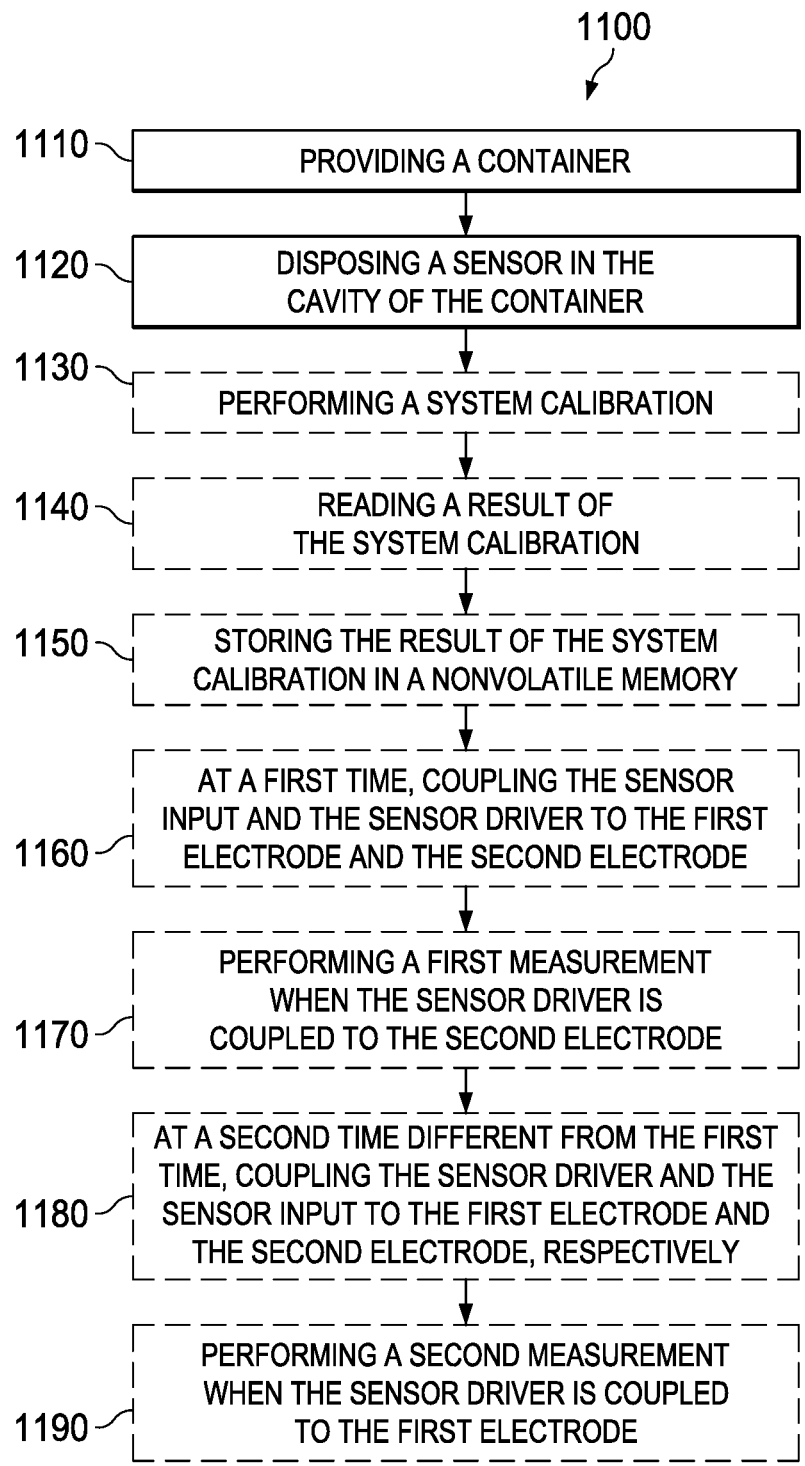
FIG. 11 is a flowchart.

FIG. 11 is a flowchart 1100 of a method for detecting a liquid level according to at least one embodiment. At box 1110, a container (e.g., container 402) is provided. The container has a cavity. At box 1120, a sensor (e.g., sensor 102) is disposed in the cavity of the container, such that a ground pattern (e.g., ground pattern 310) on a first surface of the sensor contacts a liquid in the cavity. A first electrode (e.g., electrode 104) and a second electrode (e.g., electrode 106) are located on a second surface of the sensor. The sensor is coupled to a sensor input and a sensor driver (see, e.g., sensor capacitance input signal and sensor capacitance drive signal of FIG. 6A). A cable coupling the sensor to a touch sensor (e.g., touch sensor 116) includes a shield line that is connected to ground (see, e.g., FIG. 1B).

At box 1130, a system calibration may be performed (see, e.g., box 914, box 1014). As described earlier with reference to FIGS. 6A and 6B, performing system calibration results in the capacitance of C2 being set equal to the capacitance of C1. When the liquid level is considered to be 0% (e.g., empty) at an initial time, the capacitance of C1 may not be readily determined. Accordingly, operations of the first phase (see, e.g., FIG. 6A) and operations of the second phase (see, e.g., FIG. 6B) are repeated until the capacitance of C2 is decided such that the voltage Vf across the capacitor Cf becomes equal to 0V. As such, calibration is performed at an initial time in order to decide the capacitance of C2.

At box 1140, a result of the system calibration may be read. At box 1150, the result of the system calibration may be stored in a nonvolatile memory that includes an EEPROM and/or a flash memory. The nonvolatile memory may be external of the touch sensor, or internal to the touch sensor.

At box 1160, at a first time, the sensor input and the sensor driver are coupled to the first electrode and the second electrode, respectively. At box 1170, a first measurement may be performed at the first time when the sensor driver is coupled to the second electrode. For example, with reference back to FIG. 6A, the output at terminal 616 is measured when the sensor driver is coupled to the terminal 604. At box 1180, at a second time different from the first time, the sensor driver and the sensor input are coupled to the first electrode and the second electrode, respectively. At box 1180, a second measurement may be performed at the second time when the sensor driver is coupled to the first electrode. An average of the first measurement and the second measurement may be determined.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for detecting a liquid level, comprising:
providing a container having a cavity;
disposing a printed circuit board in the cavity of the container, the printed circuit board having:
a ground pattern on a first surface positioned to contact a liquid in the cavity; and
a first electrode and a second electrode located on a second surface of the sensor;
connecting the first and second electrodes to a touch sensor via shielded conductors; and
configuring the touch sensor to provide an output voltage indicative of a level of said liquid in the cavity, said configuring including:
coupling the first electrode to a sensor input node, the sensor input node being coupled to: a first supply voltage by a reference capacitor, an output voltage node by a feedback capacitor, and to an inverting input of an operational amplifier that drives the output voltage node, the operational amplifier having a noninverting input node coupled to an intermediate voltage;
coupling the second electrode to a sensor driver node, the sensor driver node being coupled to a second supply voltage while the feedback capacitor is momentarily shorted, thereby setting the sensor input node to the intermediate voltage with the feedback capacitor being discharged; and swapping the first and second supply voltages, thereby causing the operational amplifier to produce said output voltage.

2. The method of claim 1, wherein said coupling the first electrode to the sensor input node and said coupling the second electrode to the sensor driver node occur at a first time, and at a second time different from the first time, said configuring includes coupling the first electrode to the sensor driver node and coupling the second electrode to the sensor input node.

3. The method of claim 2, further comprising:
performing a first measurement of the output voltage at the first time; and
performing a second measurement of the output voltage at the second time.

4. The method of claim 3, further comprising determining an average of the first measurement and the second measurement.

5. The method of claim 4, wherein the average is determined by a microcontroller, an application-specific integrated circuit (ASIC), a system-on-chip (SOC), a digital signal processor (DSP), or the touch sensor.

6. The method of claim 1, further comprising:
calibrating the touch sensor in part by adjusting the reference capacitor to a value that provides a zero output voltage when the cavity is empty.

7. An apparatus for detecting a liquid level, comprising:
a printed circuit board positioned in a cavity of a container, the printed circuit board having:
a ground pattern positioned on a first surface of the printed circuit board to contact a liquid in the cavity; and
a first electrode and a second electrode positioned on a second surface of the printed circuit board; and
shielded conductors that connect the first and second electrodes to a touch sensor the touch sensor including:

a sensor input node coupled to: a first supply voltage by a reference capacitor, an output voltage node by a feedback capacitor, and to an inverting input of an operational amplifier that drives the output voltage node, the operational amplifier having a noninverting input node coupled to an intermediate voltage, said sensor input node being coupled to the first electrode;

a sensor driver node coupled to a second supply voltage while a switch momentarily shorts the reference capacitor thereby setting the sensor input node to the intermediate voltage with the feedback capacitor being discharged, said sensor driver node being coupled to the second electrode; and a controller that swaps the first and second supply voltages, causing the operational amplifier to drive the output voltage node to an output voltage indicating the liquid level in the cavity.

8. The apparatus of claim 7, wherein the first electrode is coupled to the sensor input node and the second electrode is coupled to the sensor driver node at a first time, and at a second time different from the first time, the first electrode is coupled to the sensor driver node and the second electrode is coupled to the sensor input node.

9. The apparatus of claim 8, wherein:
the sensor performs a first measurement of the output voltage at the first time; and
the sensor performs a second measurement of the output voltage at the second time.

10. The apparatus of claim 9, wherein an average of the first measurement and the second measurement is determined.

11. The apparatus of claim 9, further comprising a microcontroller, an application-specific integrated circuit (ASIC), a system-on-chip (SOC), a digital signal processor (DSP), or the touch sensor that determines an average of the first measurement and the second measurement.

* * * * *